(12) United States Patent
Nguyen et al.

(10) Patent No.: US 11,990,186 B2
(45) Date of Patent: *May 21, 2024

(54) ONE-LADDER READ OF MEMORY CELLS COARSELY PROGRAMMED VIA INTERLEAVED TWO-PASS DATA PROGRAMMING TECHNIQUES

(71) Applicant: Micron Technology, Inc., Boise, ID (US)

(72) Inventors: Phong Sy Nguyen, Livermore, CA (US); James Fitzpatrick, Laguna Niguel, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/724,940

(22) Filed: Apr. 20, 2022

(65) Prior Publication Data

US 2022/0246214 A1 Aug. 4, 2022

Related U.S. Application Data

(63) Continuation of application No. 17/127,502, filed on Dec. 18, 2020, now Pat. No. 11,335,407.

(51) Int. Cl.
*G11C 16/10* (2006.01)
*G06F 3/06* (2006.01)
(Continued)

(52) U.S. Cl.
CPC ............ *G11C 16/10* (2013.01); *G06F 3/0604* (2013.01); *G06F 3/0644* (2013.01);
(Continued)

(58) Field of Classification Search
CPC ..................................................... G11C 16/10
See application file for complete search history.

(56) References Cited

U.S. PATENT DOCUMENTS 10,109,361 B1 10/2018 Khakifirooz et al.
11,335,407 B1 5/2022 Nguyen et al.
(Continued)

OTHER PUBLICATIONS

Interleaved Two-Pass Data Programming Techniques with Reduced Write Amplification, U.S. Appl. No. 17/127,413, filed Dec. 18, 2020, Phong Nguyen et al., Patented Case, Dec. 22, 2021.

(Continued)

*Primary Examiner* — Douglas King
(74) *Attorney, Agent, or Firm* — Greenberg Traurig

(57) ABSTRACT

A memory system to store multiple bits of data in a memory cell. A memory device coarsely programs a threshold voltage of the memory cell to a first level representative of a combination of bit values according to a mapping between bit value combinations and threshold levels. The threshold levels are partitioned into groups, each containing a subset of the threshold levels and having associated read voltages separating threshold levels in the subset. A group identification of a first group, among the groups, containing the first level is determined for the memory cell. The memory device applies read voltages of different groups, interleaved in an increasing order in a sequence, to read the memory cell when a read voltage applied is associated with the first group. The data bits read back from the memory cell are used to finely program the threshold voltage of the memory cell.

20 Claims, 13 Drawing Sheets

(51) Int. Cl.
*G11C 11/56* (2006.01)
*G11C 16/26* (2006.01)
*G11C 16/04* (2006.01)

(52) U.S. Cl.
CPC .......... *G06F 3/0656* (2013.01); *G06F 3/0659* (2013.01); *G06F 3/0679* (2013.01); *G11C 11/56* (2013.01); *G11C 16/26* (2013.01); *G11C 16/0483* (2013.01)

(56) References Cited

U.S. PATENT DOCUMENTS

| | | | |
|---|---|---|---|
| 11,430,526 | B2 | 8/2022 | Nguyen et al. |
| 11,456,038 | B2 | 9/2022 | Nguyen et al. |
| 11,462,265 | B2 | 10/2022 | Nguyen et al. |
| 2005/0162923 | A1 | 7/2005 | Guterman et al. |
| 2009/0225596 | A1 | 9/2009 | Shin et al. |
| 2010/0058145 | A1 | 3/2010 | Yoshida |
| 2010/0061151 | A1 | 3/2010 | Miwa et al. |
| 2010/0182830 | A1 | 7/2010 | Ryu et al. |
| 2013/0088928 | A1 | 4/2013 | Kwak |
| 2016/0062907 | A1 | 3/2016 | Mouler et al. |
| 2016/0163382 | A1 | 6/2016 | Conley et al. |
| 2017/0097869 | A1 | 4/2017 | Sharon et al. |
| 2022/0199154 | A1 | 6/2022 | Nguyen et al. |
| 2022/0199172 | A1 | 6/2022 | Nguyen et al. |
| 2022/0199173 | A1 | 6/2022 | Nguyen et al. |
| 2023/0005552 | A1 | 1/2023 | Nguyen et al. |

OTHER PUBLICATIONS

Reading Memory Cells Coarsely Programmed via Interleaved Two-Pass Data Programming Techniques, U.S. Appl. No. 17/127,459, filed Dec. 18, 2020, Phong Nguyen et al., Patented Case, Dec. 24, 2021.

Simplified Operations to Read Memory Cells Coarsely Programmed via Interleaved Two-Pass Data Programming Techniques, U.S. Appl. No. 17/127,476, filed Dec. 18, 2020, Phong Nguyen et al., Patented Case, Jan. 11, 2022.

Simplified Operations to Read Memory Cells Coarsely Programmed Via Interleaved Two-Pass Data Programming Techniques, U.S. Appl. No. 17/940,317, filed Sep. 8, 2022, Phong Nguyen et al., Application Undergoing Preexam Status Processing, Sep. 8, 2022.

One-Ladder Read of Memory Cells Coarsely Programmed via Interleaved Two-Pass Data Programming Techniques, U.S. Appl. No. 17/127,502, filed Dec. 18, 2020, Phong Nguyen et al., Patented Case, Apr. 27, 2022.

| QLC Level | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Top Page (TP) Bit | 1 | 1 | 1 | 1 | 0 | 0 | 1 | 1 | 0 | 0 | 0 | 0 | 1 | 1 | 0 | 0 |
| Extra Page (XP) Bit | 1 | 1 | 1 | 1 | 1 | 0 | 0 | 0 | 0 | 1 | 1 | 0 | 0 | 0 | 1 | 1 |
| Upper Page (UP) Bit | 1 | 0 | 0 | 1 | 0 | 0 | 1 | 0 | 0 | 0 | 1 | 1 | 0 | 1 | 1 | 1 |
| Lower Page (LP) Bit | 1 | 1 | 0 | 0 | 0 | 0 | 0 | 0 | 1 | 1 | 1 | 1 | 1 | 1 | 1 | 1 |
| Group ID Bit 0 | 0 | 0 | 1 | 1 | 0 | 0 | 1 | 1 | 0 | 0 | 1 | 1 | 0 | 0 | 1 | 1 |
| Group ID Bit 1 | 0 | 0 | 0 | 0 | 1 | 1 | 1 | 1 | 0 | 0 | 0 | 0 | 1 | 1 | 1 | 1 |
| Group 0 MLC Level | 0 | 1 |   |   |   |   |   |   | 2 | 3 |   |   |   |   |   |   |
| Group 1 MLC Level |   |   | 0 | 1 |   |   |   |   |   |   | 2 | 3 |   |   |   |   |
| Group 2 MLC Level |   |   |   |   | 0 | 1 |   |   |   |   |   |   | 2 | 3 |   |   |
| Group 3 MLC Level |   |   |   |   |   |   | 0 | 1 |   |   |   |   |   |   | 2 | 3 |

FIG. 6

ONE-LADDER READ OF MEMORY CELLS COARSELY PROGRAMMED VIA INTERLEAVED TWO-PASS DATA PROGRAMMING TECHNIQUES

RELATED APPLICATIONS

The present application is a continuation application of U.S. patent application Ser. No. 17/127,502 filed Dec. 18, 2020, the entire disclosures of which application are hereby incorporated herein by reference.

TECHNICAL FIELD

At least some embodiments disclosed herein relate to memory systems in general, and more particularly, but not limited to techniques to program voltage thresholds of memory cells in memory systems to store multiple bits of data per memory cell.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

FIG. 6 shows mapping to threshold levels and group identifications in two-pass programming of memory cells to store data according to one embodiment.

DETAILED DESCRIPTION

Figure 1:
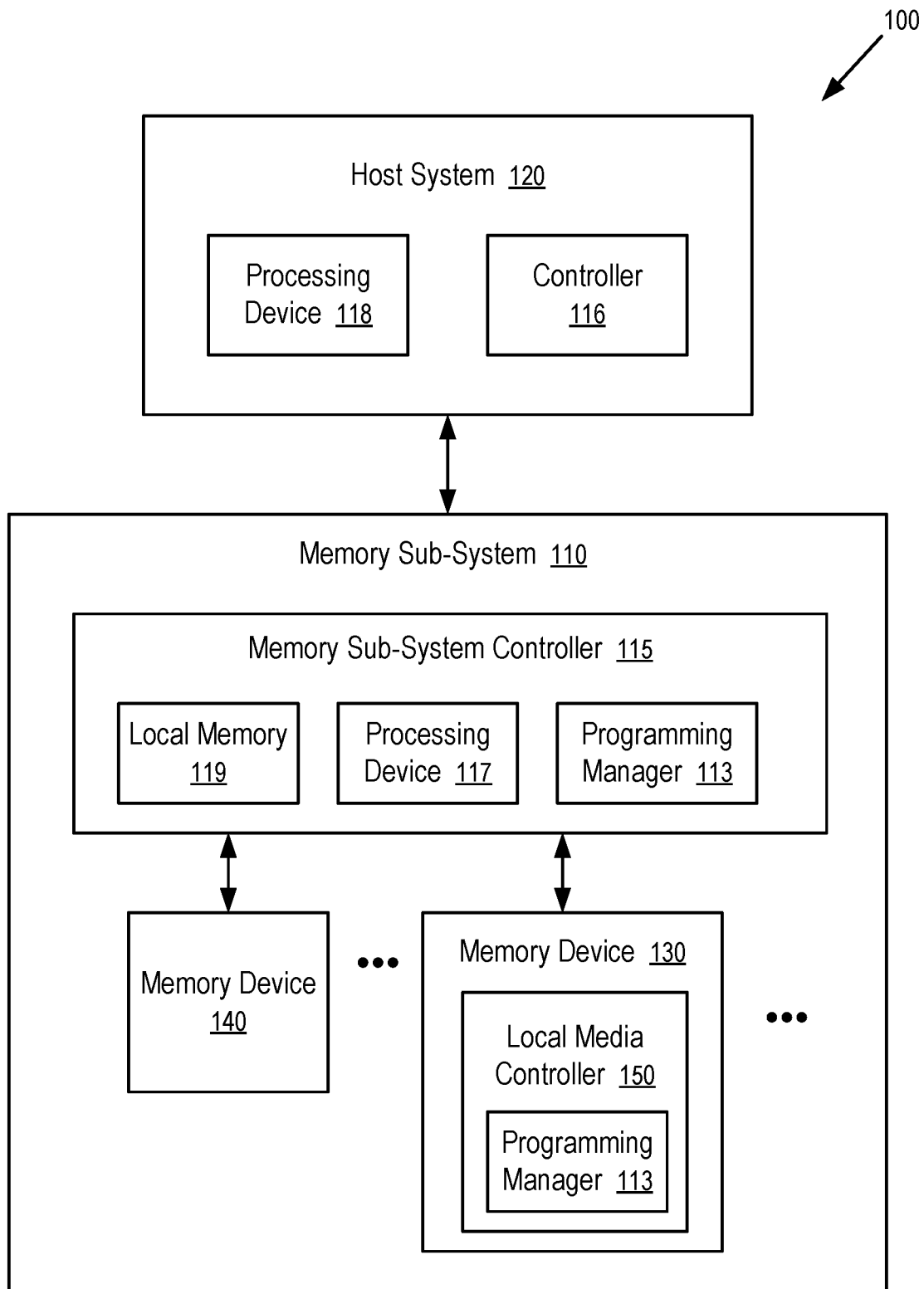
FIG. 1 illustrates an example computing system having a memory sub-system in accordance with some embodiments of the present disclosure.

At least some aspects of the present disclosure are directed to techniques to improve storing multiple bits per memory cell in a memory sub-system. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a predefined voltage. For example, if the memory cell is configured/programmed in a state that allows a substantial current to pass the memory cell at the predefined voltage, the memory cell is storing a bit of one; and otherwise, the memory cell is storing a bit of zero. Further, a memory cell can store multiple bits of data by being configured/programmed differently at multiple predefined voltages. For example, the memory cell can store multiple bits of data by having a combination of states at the multiple predefined voltages; and different combinations of the states of the memory cell at the predefined voltages can be interpreted to represent different states of bits of data that is stored in the memory cell.

Although the threshold voltage of a memory cell can be adjusted/programmed via applying voltage pulses to the memory cell, it is generally difficult to adjust/program the threshold voltage of a memory cell precisely to a predetermined voltage. A typical programming operation can move the threshold voltage of a memory cell to a voltage region, with varying probability levels of the threshold voltage actually being at different voltages within the region of threshold distribution.

Thus, a programming operation can move the threshold voltage of the memory cell into a region of threshold distribution, where the probability density level of the threshold voltage of the memory cell being at any voltage in the region is above a predetermined threshold density. A programming operation that results in a wide region of threshold distribution is coarse and thus less accurate than a programming operation that results in a narrow region of threshold distribution. A coarse programming operation is typically faster than a fine, accurate programming operation.

To store multiple bits per memory cell, the threshold voltage of the memory cell can be programmed into different regions so that each of the regions represents a different combination of bit values.

To reduce the probability of error in reading the memory cell, it is desirable to reduce, minimize, and/or eliminate overlaps in the regions of threshold voltage resulting from the programming operations. Increasing the number of bits stored per memory cell leads to the requirement to reduce the width of regions of threshold distribution and thus the requirement to increase the precision/accuracy of the programming operations.

Increasing the precision/accuracy of a programming operation generally leads to a longer time period for the data programming operation. When the time used for programming the threshold voltage of the memory cell increases, the speed of storing data in the memory cell decreases.

Multi-pass programming can be used to speed up the storing data in a memory cell by programming the threshold voltage of the memory cell to a narrow region of threshold distribution. An initial pass of coarse programming can be used to rapidly move the threshold voltage of the memory cell with less precision. As a result, the threshold voltage of the memory cell is moved to a relatively wide region of threshold distribution. A subsequent pass of fine programming can be used to fine tune and move the threshold voltage of the memory cell to a relatively narrow region of threshold voltage distribution to reduce the probability of read error. The combination of coarse programming and fine programming can be faster than directly programming the memory cell to a narrow region of threshold distribution.

Multi-pass programming can lead to increased complexity in the circuitry used to apply the multiple passes of programming. For example, buffers may be used in some implementations to store the input data for the subsequent pass of programming. Optionally, some memory cells in a memory device may be used in a single level cell (SLC) mode to store/buffer the input data temporarily, one bit per memory cell, for subsequent use in the next pass. Such an arrangement can eliminate the need for a separate type of memory cells for buffering data but increase write amplification for the memory device and/or reduced usable memory/storage capacity from the point of view of the user.

At least some aspects of the present disclosure address the above and other deficiencies by coarsely programming a number of bits per memory cell and storing group indicators of possible threshold levels of individual memory cells that are programmed coarsely. Since the group indicator eliminates some threshold levels from possibilities for reading the memory cell, the memory device can read the data back from the memory cell with accuracy, even though its threshold voltage is coarsely programmed to a wide region of threshold distribution. Since the group indicator allows the memory device to read the data stored in the memory cell in the form of its coarsely programmed threshold voltage, the coarsely programmed memory cell can function as a buffer for the data to be stored into the memory cell in the subsequent operation of fine programming. Storing the group indicator takes less resources than storing the entire data to be stored back into the memory cell in fine programming.

For example, a memory cell can be coarsely programmed to one of sixteen possible threshold levels to store 4-bit data in a quad-level cell (QLC) mode. The sixteen possible threshold levels can be divided into four groups, where the division of the groups is configured to increase the voltage gap between adjacent voltage levels in each group. For example, the threshold levels of the four groups can be fully interleaved when ordered according to voltage to increase the minimum separation among threshold levels in each individual groups.

A two-bit group indicator can be stored in one or more memory cells to represent the identification of the group of the threshold level of the memory cell. Since the group indicator limits the possible threshold levels of the memory cell to one fourth of the possible sixteen levels of 4-bit data in general, the memory device can perform a read operation to obtain the 4-bit data stored in the coarsely programmed memory cell by differentiating its coarsely programmed threshold level from four possible coarsely programmed threshold levels, which corresponds to reading a memory cell programmed to store 2-bit data (or a multi-level cell (MLC) mode). Reading data in a MLC mode can be performed accurately with a threshold programming coarser than for reading data in a QLC mode. The two-bit group indicator can be stored/buffered in two memory cells in a single level cell (SLC) mode (e.g., one bit per cell). Since the 4-bit data can be read from the coarsely programmed memory cell with the help of the two-bit group indicator, the need to buffer the 4-bit data in four memory cells in SLC mode can be eliminated. Thus, the technique can reduce write amplification and/or increase the memory/storage capacity usable by the end user.

In some implementations, the group indicator can be calculated from XOR or XNOR operations applied to the four bits to be stored in a memory cell. For example, one bit of the two-bit group indicator can be computed from XOR (or XNOR) of two of the four bits to be stored in the memory cell; and another bit of the group indicator can be computed from XOR (or XNOR) of the four bits to be stored in the memory cell.

When multiple bits from multiple memory cells respectively are configured as codewords using a linear error-correcting code (ECC) technique (e.g., Low-Density Parity-Check (LDPC)), the XOR of codewords can result in codewords having bits from group indicators of the memory cells. Hence XOR (or XNOR) of codewords preserve the decodability; and ECC techniques can be used to recover errors in reading the group indicators.

When the group indicator is computed from XOR (or XNOR) of the four bits to be stored in the memory cell, the coarsely programmed memory cell can be read to retrieve two of the four bits; and the remaining two bits can be computed from XOR (of XNOR) of the bits of the group indicator and the bit bits read from the coarsely programmed memory cell. Alternatively, the redundant information provided by the group indicator can be used to recover from errors in reading the memory cell.

Since the threshold levels of the four groups are interleaved, the read voltages for reading the four groups are also interleaved. During the reading of the memory cell coarsely programmed to threshold levels of a QLC mode, the voltage applied to the memory cell is increased to the read voltages of the four groups one after another according to an order of increasing read voltage. Thus, the state of the memory cell is tested at the monotonically increasing read voltages in one pass to determine the bit values of the data stored in the memory cell. Such a technique can reduce the overhead in ramping up the voltage applied on the memory cell during reading and thus increase the speed of two-pass programming of the memory cell.

After the data stored in the coarsely programmed memory cell is retrieved with the help of the group indicator, a fine programming operation can be applied to narrow the regions of threshold distribution such that the group indicator is no longer necessary for the accurate reading of the memory cell.

Such programming techniques can reduce the requirements in using separate memory cells to buffer data for the fine pass programming, reduce write amplification, and/or increase the memory/storage capacity available to users.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a programming manager 113 configured to perform interleaved two-pass data programming with reduced write amplification. In some embodiments, the controller 115 in the memory sub-system 110 and/or the controller 150 in the memory device 130 can include at least a portion of the programming manager 113. In other embodiments, or in combination, the controller 116 and/or the processing device 118 in the host system 120 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 120, can be configured to execute instructions stored in memory for performing the operations of the programming manager 113 described herein. In some embodiments, the programming manager 113 is implemented in an integrated circuit chip disposed in the memory sub-system 110. In other embodiments, the programming manager 113 can be part of firmware of the memory sub-system 110, an operating system of the host system 120, a device driver, or an application, or any combination therein.

For example, the programming manager 113 implemented in the controller 115 and/or the controller 150 can receive a predetermined number N of data groups (e.g., pages) for coarsely programming into a memory cell group in the memory device 130. The coarsely programmed memory cell group is subsequent finely programmed to store the predetermined number N of bits per memory cells. The programming manager 113 generates a group of multi-bit indicators (e.g., n-bit indicators) for the memory cells by applying XOR (or XNOR) operations on the data groups. The programming manager 113 initiates a coarse programming to store the predetermined number N of data groups (e.g., pages) into the memory cell group, where each memory cell in the memory cell group stores one bit from each of the predetermined number N of data groups by being programmed to one of $2^N$ threshold levels. Each memory cell in the memory cell group has a corresponding indicator that has bits each generated from an XOR or XNOR operation on some or all of its bits stored via the coarse programming. When an n-bit group indicator is used, the indicator identifies a set of possible threshold levels of the memory cell among $2^n$ possible sets of threshold levels. When the indicator has a particular set of bit values, the set of possible threshold levels of the memory cell corresponds to eliminating, from the $2^N$ threshold levels, $2^n-1$ consecutive threshold levels after each threshold level selected for the group. The first $2^n$ of the $2^N$ threshold levels are selected for the $2^n$ groups respectively. Thus, the threshold levels of the $2^n$ groups are interleaved in the $2^N$ threshold levels representing the $2^N$ possible combinations of the values of N bits. Since the group indicators eliminate the intervening threshold levels, the memory device can read the data coarsely programmed into the memory cell group by differentiating $2^{N-n}$ n coarsely programmed regions of threshold distributions. For example, the programming precision of storing N-n bits per memory cell can be sufficient to read a memory cell programmed in a particular group to store N-bit of data, with the help of the group indicator that identifies the particular group. For example, a memory cell coarsely programmed in QLC mode but with MLC programming accuracy can be accurately read with a 2-bit group indicator; and the bits of the group indicators can be computed from XOR (or XNOR) of two of the 4 bits and from XOR (or XNOR) of the 4 bits. The XOR (or XNOR) preserves the ECC decodability of the indicator group. Thus, the reliability of reading the group indicator is improved.

The n-bit group indicator provides n-bit redundant information for the N bits of data coarsely programmed in a memory cell. Thus, the memory device can be configured to read only N-n bits of data from the memory cell and obtain the remaining n bits using the n-bit redundant information provided by the n-bit group indicator. Alternatively, the N-bit data and n-bit group indicator can be used to form a codeword for error recovery using an ECC technique (e.g., LDPC).

The read voltages of the $2^n$ groups can be combined as a list of voltages in a monotonically increasing order for sensing and thus reading the coarsely programmed memory cell group. The memory cell group is applied a voltage starting from the lowest one in the list to the highest one in the list. At each applied read voltage, the memory device senses whether a substantial current can pass a memory cell at the applied read voltage. The result of sensing the current can be used to update a relevant bit to be stored in a memory cell in a relevant group. Through sensing each of the read voltages once in the increasing order, the memory cells of all groups can be read for multiple data groups. Thus, it is not necessary to ramping up voltages multiple passes to read different groups separately. The combined read reduces overhead and thus improves the speed of the two-pass programming operation.

Figure 2:
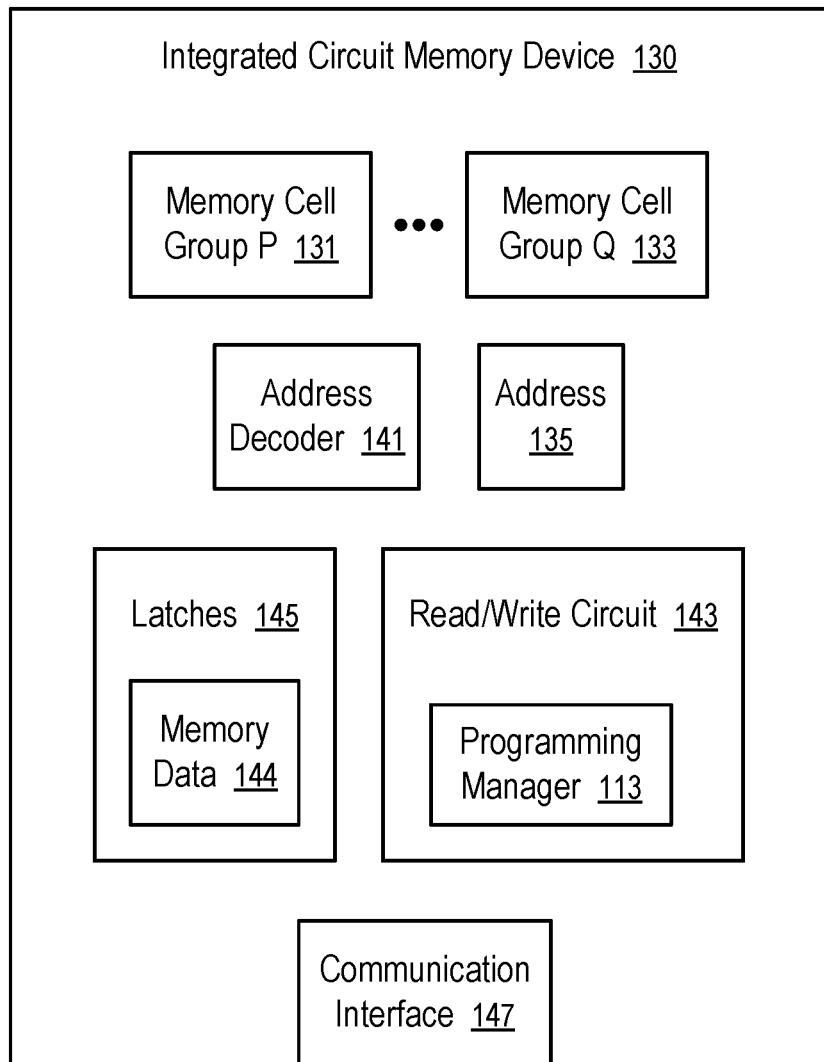
FIG. 2 illustrates an integrated circuit memory device having a programming manager configured to program threshold voltages of memory cells to store data according to one embodiment.

FIG. 2 illustrates an integrated circuit memory device having a programming manager configured to program threshold voltages of memory cells to store data according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, ..., 133 of memory cells that can be formed in one or more integrated circuit dies. A typical memory cell in a group 131 (or group 133) can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 144 from memory cells identified by the memory address 135, and provide at least the memory data 144 as part of a response to the command. Optionally, the memory device 130 may decode the memory data 144 (e.g., using an error-correcting code (ECC) technique) and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 144 stored in the memory cells at the address 135.

The integrated circuit memory device 130 has a set of latches 145 to hold memory data 144 temporarily while the read/write circuit 143 is programming the threshold voltages of a memory cell group (e.g., 131 or 133). For example, the read/write circuit 143 can program the threshold voltages of memory cells in a memory cell group 131 to store N bits per memory cell. The memory cell group (e.g., 131 or 133) has M memory cells. The latches 145 are configured to store N·M bits of data in the form of N data groups. Each of the data group has M bits of data to be stored respectively into M memory cells in the memory cell group (e.g., 131 or 133).

When the latches 145 have N data groups to be stored into a memory cell group (e.g., 131), the programming manager 113 is configured to determine and program threshold voltage levels of memory cells in the memory cell group (e.g., 131). The threshold voltage levels can be determined according to the values of bits in the memory data 144 and a Gray code that maps bit value combinations to threshold levels, such that any two combinations of bit values represented by two successive threshold levels differ by and only by one bit.

In one embodiment, the memory device 130 receives N data groups from the controller 115 of the memory sub-system 110 for coarse programming of the threshold voltages of memory cells in a memory cell group (e.g., 131). The operating of coarse programming moves the threshold voltages of the memory cells to voltage regions that are close to the threshold levels for storing N data groups. The coarse programming is configured to store the N data groups to the memory cell group, where each memory cell stores one bit from each of the N data groups. The coarse programming maps the N bit values to be stored in each memory cell to its coarsely programmed threshold level, which is one of the $2^N$ possible threshold levels used to represent $2^N$ possible combinations of N-bit data. An indicator is generated to identify a subset of the $2^N$ threshold levels that contains the coarsely programmed threshold level of the memory cell. An n-bit indicator can reduce the subset to $2^{N-n}$ threshold levels, allowing the region of threshold distribution to be coarsely programmed to an accuracy level for reading a memory cell programmed to store N-n bits. Such an arrangement can reduce the precision requirement for the coarse programming and the time to perform the coarse programming and/or improve the accuracy of reading the N bit values from each coarsely programmed memory cell. The group indicators can be stored in other memory cell groups (e.g., 133), with each memory cell group (e.g., 133) being used to store one indicator bit in a SLC mode. To perform the fine programming, the group indicators can be read from the memory cell groups (e.g., 133) and used to further read the coarsely programmed memory cell group (e.g., 131). Since no further input is required from the controller 115 of the memory sub-system 110, the fine programming can be scheduled for performance at a later time (e.g., when the memory device is idling, or less busy). To perform fine programming, the memory device 130 reads the group indicator, reads the data from the coarsely programmed memory cell group (e.g., 131), and applies voltage pulses to narrow the regions of threshold distributions such that the finely programmed memory cell group (e.g., 131) can be read without the help of the group indicators. After the fine programming, the group indicators can be discarded or deleted.

In some implementations, the threshold levels of the coarse and fine programming are determined using a Gray code, as illustrated in FIG. 6. A Gray code can map a combination of bit values to a threshold level such that one bit and only one bit is changed in the bit values when the threshold level represented by the bit value combination changes to the next larger or smaller threshold level. In some implementations, the indicator group can be computed by applying XOR (or XNOR) to the N data groups.

Figure 3:
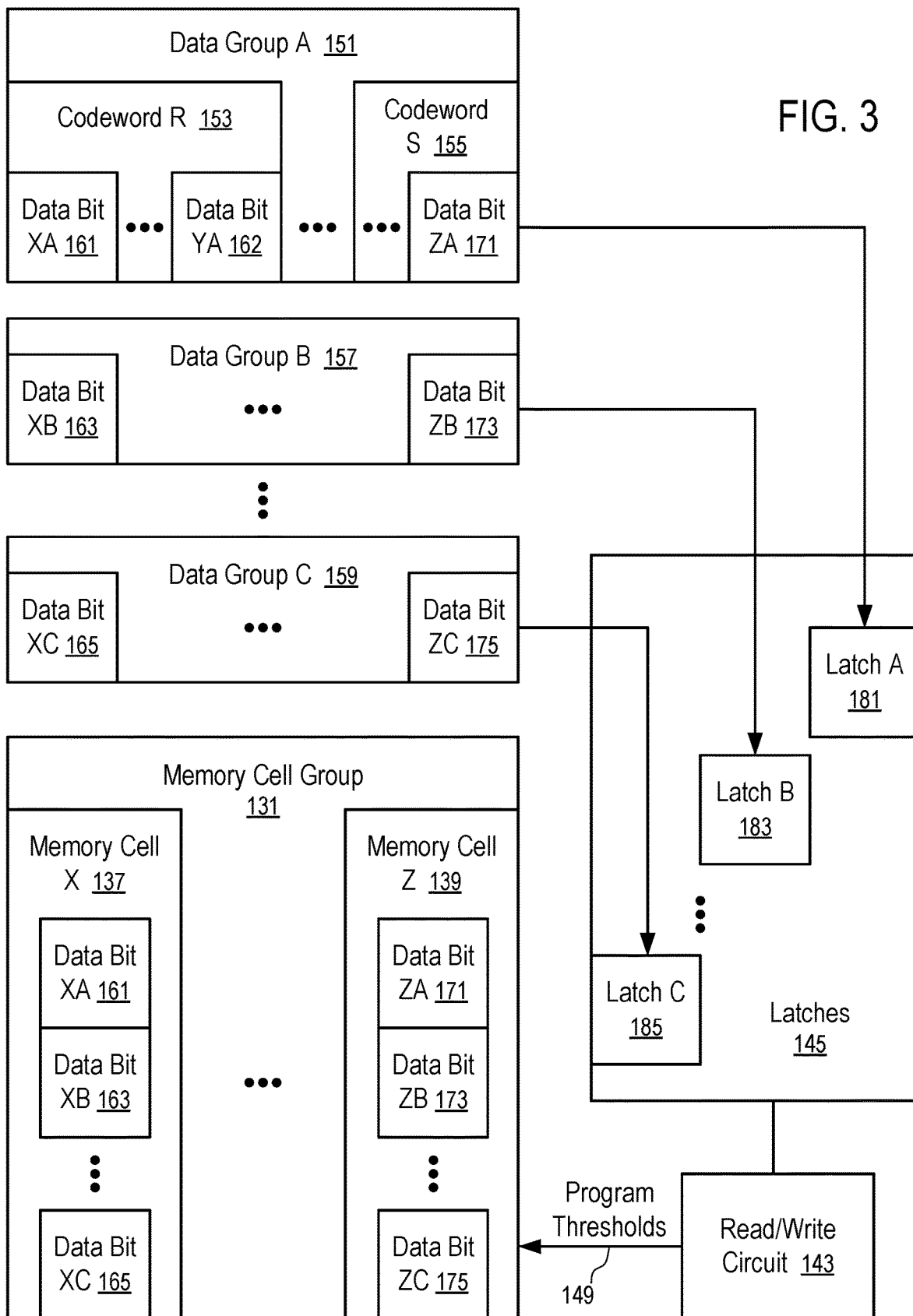
FIG. 3 shows an example of programming memory cells to store multiple bits per memory cell according to one embodiment.

FIG. 3 shows an example of programming memory cells to store multiple bits per memory cell according to one embodiment. For example, the example of FIG. 3 can be implemented in the memory device 130 of FIG. 1 and/or FIG. 2.

In FIG. 3, a memory cell group 131 has memory cells 137, ..., 139. A number of data groups 151, 157, ..., 159 provide data bits to be stored into the memory cells 137, ..., 139. The number of bits provided in each data group (e.g., 157, 159, or 151) equals to the number of memory cells 137 to 139 in the memory cell group 131. Each memory cell (e.g., 139 or 137) stores a set of bits, one from each of the data groups 151, 157, ..., and 159.

For example, the data bits 161, 163, ..., 165 from the data groups 151, 157 ..., 159 are stored into one memory cell 137; and the voltage threshold of the memory cell 137 is programmed by the read/write circuit 143 at a level that represents the values of the data bits 161, 163, ..., 165. Similarly, the data bits 171, 173, ..., 175 from the data groups 151, 157 ..., 159 are stored into another memory cell 139 and represented by the level of the voltage threshold of the memory cell 139.

Optionally, the data bits in a data group can be organized in codeword 153, codeword 155 according to an error detection and data recovery technique, such as Error Correction Code (ECC) (e.g., Low-Density Parity-Check (LDPC) code).

For example, a codeword 153 in the data group 151 can include data bit 161 to data bit 162. When one of data bit in the codeword 153 is in error, the error can be detected and corrected (e.g., using a technique of Low-Density Parity-Check (LDPC)).

When the data groups 151, 157, ..., 159 are stored in the latches 181, 183, ..., 185, the read/write circuit 143 can program 149 thresholds of the memory cells 137, ..., 139 such that the voltage thresholds of the memory cells 137, ..., 139 represent the values of the respective data bits from the data groups 151, 157, ..., 159.

A combination of the values of the data bits (e.g., 161, 163, ..., 165) to be stored in a memory cell (e.g., 137) is mapped to the level of a voltage threshold of the memory cell (e.g., 137) based on a Gray code. For example, a read/write circuit 143 can include a table of a Gray code (e.g., as illustrated by the table of FIG. 6) to map between the values of a set of data bits (e.g., 161, 163, ..., 165) of a memory cell (e.g., 137) and a threshold level of the memory cell (e.g., 137) that represents the values of the set of data bits (e.g., 161, 163, ..., 165).

To accelerate the operation to program 149 threshold voltages of the memory cells 137, ..., 139 to store the data groups 151, 157, ..., 159, the read/write circuit 143 can be configured to use two-pass programming operations. In a first coarse programming, the threshold voltages of the memory cell group 131 are moved to relatively wide regions of threshold distribution near the fine regions of threshold distributions. The coarsely programmed threshold voltages are determined based on threshold levels representative of the data groups 151, 157, ..., 159. A group of threshold level indicators is computed and stored/buffered temporarily to assist the accurate reading of the data groups 151, 157, ..., 159 from the coarsely programmed memory cell group 131. After reading the data groups 151, 157, ..., 159 back into the latches 183, ..., 185, the read/write circuit 143 can perform the fine programming to move the threshold voltages of the memory cells 137, ..., 139 into fine regions of threshold distributions representative of the data bits in the data groups 151, ..., 157, 159, as discussed in further details below in connection with FIGS. 4 to 12.

Figure 4:
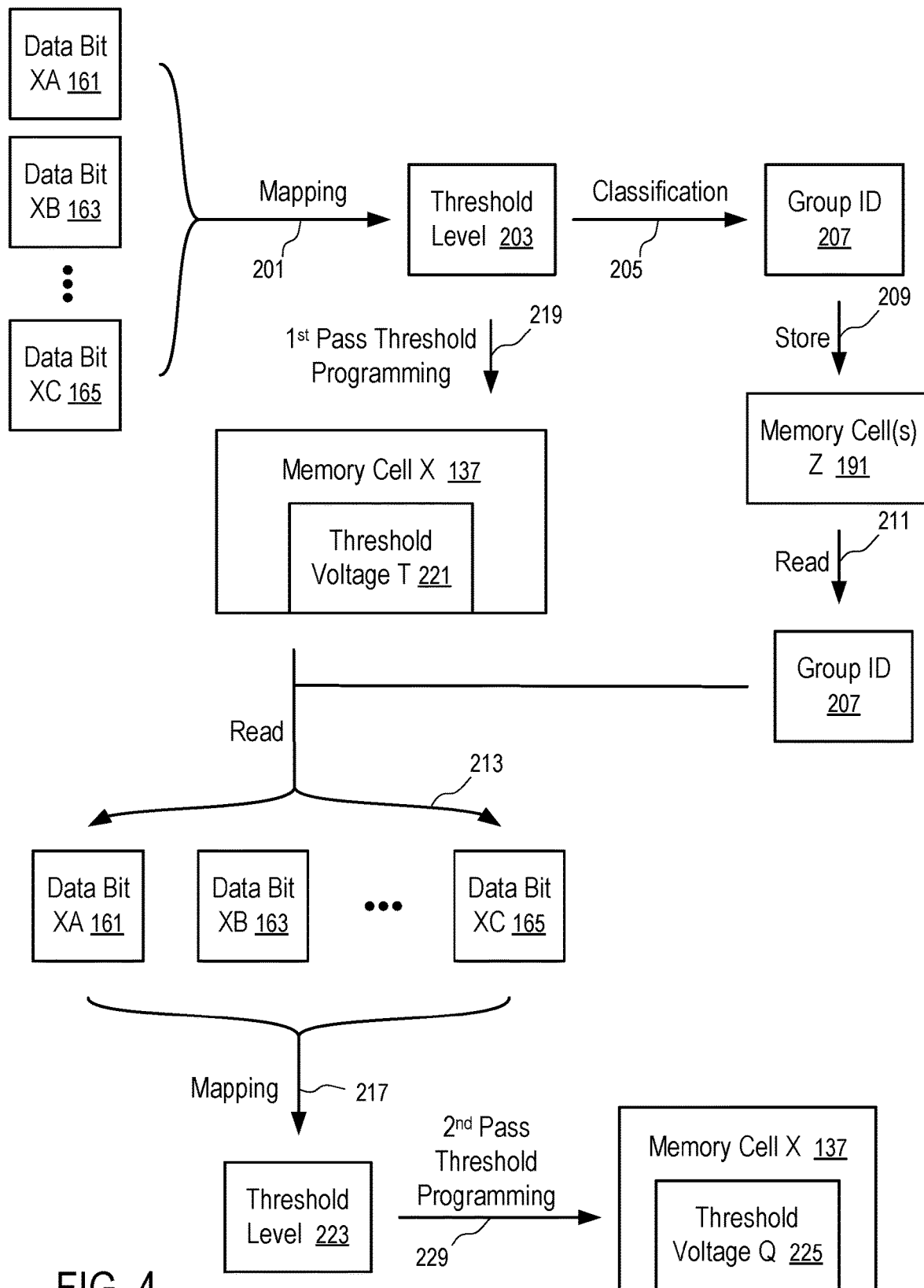
FIG. 4 shows a two-pass programming technique to store multiple bits per memory cell according to one embodiment.

FIG. 4 shows a two-pass programming technique to store multiple bits per memory cell according to one embodiment. For example, the technique of FIG. 4 can be implemented in the memory device 130 of FIG. 2 in a memory sub-system 110 of FIG. 1.

In FIG. 4, a number (N) of data bits 163 to 165 are used to determine coarse programming threshold level T 203 through a mapping 201 between bit value combinations and coarse programming threshold levels.

All possible coarse programming threshold levels are classified into $2^n$ groups. For example, the $2^N$ coarse programming threshold levels are numbered in an increasing order. The classification 205 is configured to place the first $2^n$ threshold levels into $2^n$ groups respectively. For each of the $2^n$ groups, the classification 205 is configured to remove the next consecutive $2^{n-1}$ threshold levels to select the next threshold level for the group. Thus, the $2^N$ coarse programming threshold levels are equally divided into $2^n$ groups, each having $2^{N-n}$ threshold levels. Each pair of adjacent threshold levels in a group is separated by $2^n-1$ threshold levels that belong to other groups. The threshold levels in the group are interleaved. The group identification 207 provides the identification of the group that contains the threshold level 203 of a memory cell 137 after the coarse programming. Since the group identification 207 limits the threshold level 203 to one of $2^{N-n}$ threshold levels, the coarse programming can be performed with accuracy sufficient to read from memory cells storing N-n bit per memory cell.

A first pass operation of threshold programming 219 is performed to move the threshold voltage 221 of the memory cell 137 of a memory cell group 131 to a relatively wide region of threshold distribution. The read/write circuit 143 can store 209 the group identification 207 of the memory cell 137 in one or more other memory cells 191 (e.g., in a different memory cell group 133 in a SLC mode).

Figure 5:
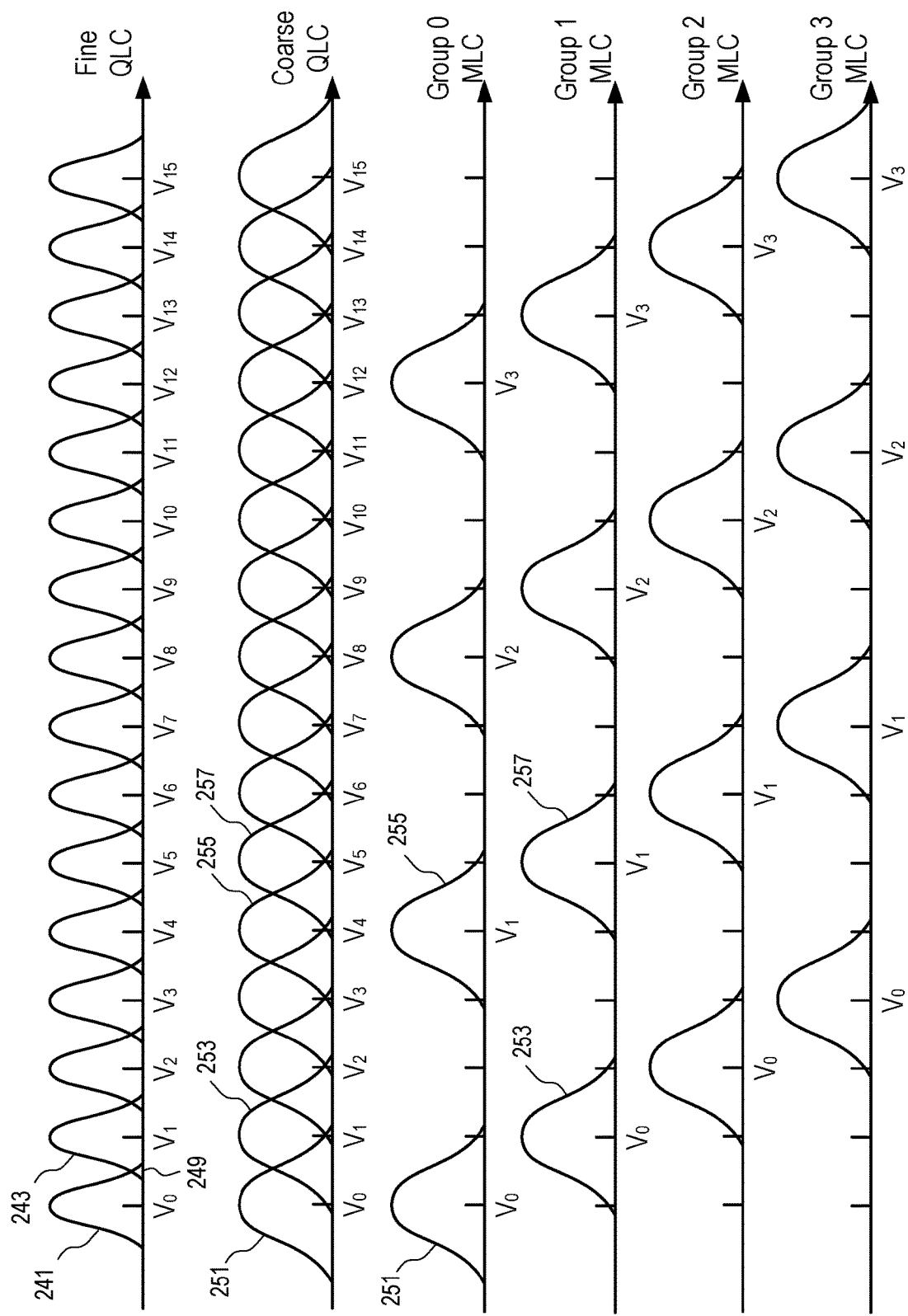
FIG. 5 illustrates voltage distributions for two-pass programming of memory cells according to one embodiment.

For the fine programming of the memory cell 137 to store the data bits 161, 163, . . . , 165, the read/write circuit 143 can read 211 the group identification of the memory cell 137 from the memory cells 191 to assist the operation to read 213 the memory 137 for the retrieval of the data bits 161, 163, . . . , 165. The group identification 207 eliminates $2^n-1$ groups of the possible threshold levels representative of the values of the data bits 161, 163, . . . , 165. Thus, the group identification allows the read/write circuit 143 to determine the values of the data bits 161, 163, . . . , 165 from the threshold voltage 221 that is coarsely programmed into a relatively wide region of threshold distribution, as illustrated in FIG. 5. The read/write circuit 143 can read 213 the data bits 161, 163, . . . , 165 from the memory cell 137 into the latches 183, . . . , 185 respectively.

During the fine programming of the memory cell 137, the data bits 161, 163, . . . , 165 in the latches 181, 183, . . . , 185 are again used to determine the fine programming threshold levels 223 through a mapping 217 between bit value combinations and fine programming threshold levels. The mapping 217 to the threshold level 223 for fine programming can be the same as the mapping 201 to the threshold level 203 for the coarse programming.

A second pass operation of threshold programming 229 is performed to move the threshold voltage 225 of the memory cell 137 of a memory cell group 131 to a relatively narrow region of threshold distribution. The region is sufficiently narrow to allow the read/write circuit 143 to determine the data bits 161, 163, . . . , 165 based on sensing the threshold voltage 225 of the memory cell 137. Thus, the group identification 207 can be discarded after the second pass operation of threshold programming 229.

FIG. 5 illustrates voltage distributions for two-pass programming of memory cells according to one embodiment. For example, the two-pass programming technique of FIG. 4 can be implemented based on the distributions illustrated in FIG. 5 to store data in a QLC mode (four bits per memory cell).

In FIG. 5, to program a memory cell 137 to store data in the QLC mode, the threshold voltage of the memory cells is moved to one of 16 QLC threshold levels 0, 1, . . . , 15 centered at voltages $V_0, V_2, \ldots, V_{15}$.

After the fine QLC threshold programming 229, the regions of threshold distributions are narrow, as illustrated by the curves illustrated for fine QLC. For example, when the memory cell 137 is finely programmed to QLC threshold level 0, the probability level of the threshold voltage of the memory cell 137 being at voltages near $V_0$ is illustrated by a curve 241 centered at $V_0$. The voltage range of the curve 241 represents the region of threshold distribution at QLC threshold level 0 after fine QLC programming.

Similarly, when the memory cell 137 is finely programmed to QLC threshold level 1, the probability level of the threshold voltage of the memory cell 137 being at voltages near $V_1$ is illustrated by a curve 243 centered at $V_1$. The voltage range of the curve 243 represents the region of threshold distribution at QLC threshold level 1 after fine QLC programming.

At the voltage region 249, the curves 241 and 243 overlap with each other, which indicates that when the threshold voltage of the memory cell 137 is found in the region 249, there is an ambiguity as to whether the memory cell 137 is programmed at threshold level 0 to represent one set of bit values, or at threshold level 1 to represent another set of bit values. When the mapping between the bit value combinations and threshold levels is based on a Gray code, the bit values represented by threshold level 0 and threshold level 1 differ by one bit. Thus, there is a small probability that this bit, determined based on the threshold voltage of the memory cell 137, is read incorrectly. An error in such a bit can be typically detected and corrected via ECC/LPDC decoding of a codeword (e.g., 153) in a data group (e.g., 151) that contains the bit. Reducing the overlapping region can improve the accuracy in reading the memory cell 137. However, reducing the widths of the distribution curves 241, 243 requires higher precision and thus longer time in programming the threshold voltage of the memory cell 137.

In FIG. 5, to program the threshold voltage of the memory cell 137 to the fine QLC levels with narrow distribution curves 241, 243, etc., the read/write circuit 143 of the memory device 130 initially programs coarsely the memory cells to corresponding coarse QLC levels according to the four data bits (e.g., 161, 163, . . . , 165) to be stored in the memory cell 137.

For example, when the four data bits of the memory cell 137 is coarsely programmed to QLC threshold level 0, the probability level of the threshold voltage of the memory cell 137 being at voltages near $V_0$ is illustrated by a curve 251 centered at $V_0$. The voltage range of the curve 251 represents the region of threshold distribution at QLC threshold level 0 after the coarse programming.

Similarly, when the three data bits of the memory cell 137 is coarsely programmed to QLC threshold level 1, the probability level of the threshold voltage of the memory cell 137 being at voltages near $V_1$ is illustrated by a curve 253 centered at $V_1$. The voltage range of the curve 253 represents the region of threshold distribution at QLC threshold level 1 after the coarse programming.

The coarse QLC curves (e.g., 251 and 253) have significant overlap with each other, which can lead to many read errors.

To reduce the time for coarse programming and to reduce read errors, a group identification 207 is computed and/or stored to identify a group of threshold levels that contains the threshold level of the coarsely programmed memory cell 137.

In FIG. 5, the sixteen threshold levels of the coarse QLC programming are divided into four groups. The first four levels $V_0, V_1, V_2$, and $V_3$ of the coarse QLC programming are assigned to groups 0, 1, 2 and 3 respectively. For each group, the next selected threshold levels can be identified by elimination the next consecutive three threshold levels. Thus, each group has four threshold levels, corresponding to the threshold levels of an MLC mode.

For example, the threshold level $V_0$ of coarse QLC programming is selected for Group 0 as its threshold level $V_0$ for MLC reading. After eliminating the next 3 consecutive threshold levels $V_1, V_2$, and $V_3$ of coarse QLC programming, threshold level $V_4$ of coarse QLC programming is selected for Group 0 as its next threshold level $V_1$ of MLC reading. Thus, the threshold levels $V_0, V_4, V_8$ and $V_{12}$ of the coarse QLC programming are classified as threshold levels $V_0, V_1, V_2$, and $V_3$ in Group 0 of MLC reading. If the memory cell 137 is coarsely programmed to any of the threshold levels $V_0, V_4, V_8$ and $V_{12}$, the memory cell 137 is classified to be in Group 0 for the reading of its data. The threshold levels of other Group 1, 2, or 3 for MLC reading are selected in a similar way.

When the group identification 207 indicates that the memory cell 137 is coarsely programmed to a threshold level contained in Group 0 for MLC reading, the possible threshold voltage distributions are represented by the alternating curves 251, 255, etc. The distribution curves of Groups 1, 2, and 3 for MLC reading are not possible. Thus, the threshold voltage of the memory cell 137 can be mapped back to a threshold level without ambiguity and be mapped back to the bit values represented by the threshold level.

Similarly, when the group identification 207 indicates that the memory cell 137 is coarsely programmed to a threshold level in Group 1 for MLC reading, the possible threshold voltage distributions are represented by the alternating curves 253, 257, etc. The distribution curves of other threshold levels (e.g., curve 251) are not possible. Thus, the threshold voltage of the memory cell 137 can be mapped back to a unique threshold level and the bit values represented by the corresponding threshold level.

The group identification 207 allows the read/write circuit 143 to differentiate the alternating distribution curves (e.g., 251, 255, . . . , in Group 0; or 253, 237, . . . , in Group 1) for a coarsely programmed memory cell. The reduced number of distribution curves (e.g., 251, 255, . . . , in Group 0; or 253, 237, . . . , in Group 1) can be read in an MLC mode. Thus, the distribution curves (251, 255, . . . ; 253, 257, . . . ) of the coarse QLC programming can be as coarse as programmed for MLC modes; and the coarsely programmed memory cell 137 can be read in a MLC mode identified by the group identification 207.

For example, based on the group identification 207 identifying the memory cell 137 being coarsely programmed according to a level in Group 0, the read/write circuit 143 can use a Group 0 MLC read mode to determine the coarsely programmed threshold level of the memory cell 137 and thus the four data bits (e.g., 163, . . . , 165) stored in the memory cell 137 through coarse programming.

Similarly, based on the group identification 207 identifying the memory cell 137 being coarsely programmed according to a level in Group 1, the read/write circuit 143 can use a Group 1 MLC read mode to determine the coarsely programmed threshold level of the memory cell 137 and thus the four data bits (e.g., 163, . . . , 165) stored in the memory cell 137 through coarse programming.

From an alternative point of view, the threshold distribution curves of each group (e.g., 0, 1, 2, or 3) can be seen as the result of programming the corresponding data to the respective threshold levels in a respective MLC mode; and the MLC threshold levels of each group is configured to represent respective QLC threshold levels and thus the corresponding four bit values. The voltage levels of different Groups 0, 1, 2, and 3 MLC programming are offset from each other so that none of their distribution curves overlap with each other (or the overlap is reduced/minimized to allow occasional errors to be corrected through ECC operations); and the collection of the voltage levels of the Groups 0, 1, 2, and 3 MLC programming corresponds to the threshold levels of the QLC programming. Based on the group identification 207, the memory cell 137 is to be read according to the one of the Groups 0, 1, 2 and 3 MLC modes.

After the threshold voltage of the memory cell 137 is coarsely programmed to a coarse QLC level, the threshold voltage of the memory cell 137 can be further finely programmed to a corresponding fine QLC level to represent the four data bits (e.g., 161, 163, . . . , 165) stored in the memory cell 137. The regions of threshold distributions of the fine QLC levels are reduced in width, from the corresponding coarse QLC levels, such that the memory device 130 can determine the programmed threshold levels from the threshold voltage of the memory cell 137 without the help of the group identification 207.

FIG. 6 shows mapping to threshold levels and group identifications in two-pass programming of memory cells to store data according to one embodiment. For example, the mapping of FIG. 6 can be used with the distribution curves illustrated in FIG. 5.

FIG. 6 illustrates an example of data programming in a QLC mode where the threshold voltage of a memory cell (e.g., 137) is programmed to represent the values of four bits. A page of memory cells is programmed (written into) together. Since each cell stores four bits, the page of memory cells can store four data pages of data bits, where the number of data bits in a data page is equal to the number of memory cells in a memory cell page. For example, each data page is an example of a data group illustrated in FIG. 3; and the memory cell page is an example of a memory cell group illustrated in FIG. 3.

Conventionally and/or for convenience, the four data pages for a QLC mode are named as lower page (LP), upper page (UP), extra page (XP), and top page (TP) respectively. A memory cell (e.g., 137) in a QLC mode stores one bit from each of the four pages. Since the values of the four data bits stored in a memory cell (e.g., 137) have 16 different combinations, as illustrated in the table shown in FIG. 6, the threshold voltage of the memory cell (e.g., 137) is programmed to one of 16 QLC threshold levels to represent a corresponding combination of bit values.

The table shown in FIG. 6 illustrates an example Gray code that maps between the values of the four data bits (e.g., 161, 163, . . . , 165) stored in a QLC memory cell (e.g., 137) and the threshold level 203 of the memory cell (e.g., 137). For example, when the memory cell (e.g., 137) is determined to have a QLC threshold level of 0, the memory cell (e.g., 137) is considered to store 1 as the TP bit, 1 as the XP bit, 1 as the UP bit, and 1 as the LP bit. Similarly, to store 1, 1, 0, and 1 as TP, XP, UP and LP bits in the memory cell (e.g., 137), the threshold voltage is programmed to level 1. An increasing threshold level represents an increasing threshold voltage to be programmed for the memory cell (e.g., 137).

A Gray code (e.g., as illustrated in the table of FIG. 6) has the characteristics/propriety where one and only one bit value changes between two successive threshold levels. For example, when QLC threshold level changes from 0 to 1, only the UP bit changes from 1 to 0 in the table of FIG. 6. Similarly, when QLC threshold level changes between 1 and 2 (or, 2 and 3, 3 and 4, 4 and 5, etc.), only the LP bit changes (or, the UP bit, the TP bit, the XP bit, etc. respectively).

In FIG. 6, QLC levels 0, 4, 8, 12 are arranged in Group 0; and Group 0 is identified by two-bit ID having 0 and 0 as bit 0 and bit 1 respectively. QLC levels 0, 4, 8, 12 can be seen as MLC levels 0, 1, 2 and 3 for Group 0. A memory cell 137 programmed to a QLC level in Group 0 can be read in an MLC mode that is specific for group 0.

QLC levels 1, 5, 9, 13 are arranged in Group 1; and Group 1 is identified by two-bit ID having 1 and 0 as bit 0 and bit 1 respectively. QLC levels 1, 5, 9, 13 can be seen as MLC levels 0, 1, 2 and 3 for Group 1. A memory cell 137 programmed to a QLC level in Group 1 can be read in an MLC mode for that is specific group 1.

QLC levels 2, 6, 10, 14 are arranged in Group 2; and Group 2 is identified by two-bit ID having 1 and 1 as bit 0 and bit 1 respectively. QLC levels 2, 6, 10, 14 can be seen as MLC levels 0, 1, 2 and 3 for Group 2. A memory cell 137 programmed to a QLC level in Group 2 can be read in an MLC mode that is specific for group 2.

QLC levels 3, 7, 11, 15 are arranged in Group 3; and Group 3 is identified by two-bit ID having 0 and 1 as bit 0 and bit 1 respectively. QLC levels 3, 7, 11, 15 can be seen as MLC levels 0, 1, 2 and 3 for Group 3. A memory cell 137 programmed to a QLC level in Group 3 can be read in an MLC mode that is specific for group 3.

In FIG. 6, bit 0 of group ID is equal to the XOR of TP, XP, UP and LP bits; and bit 1 of group ID is equal to the XOR of TP and LP bits. Thus, the collections of TP, XP, UP and LP bits and the bits 0 and 1 of group ID can be seen as a LDPC codeword that can be used to detect and correct errors in some of the bits in the codeword. Alternatively, the XOR relation about the bits can be used to compute some of the TP, XP, UP and LP bits from the group ID. For example, TP bit can be computed from XOR of bit 1 of group ID and LP bit; and XP bit can be computed from XOR of UP bit and bits 1 and 0 of Group ID.

FIG. 6 illustrates an example of bits 0 and 1 of Group ID computed via XOR. Alternatively, bits 0 and 1 of Group ID can be computed via XNOR.

In general, the group identification (ID) can be computed from XOR (or XNOR) of bits to be stored in a memory cell (e.g., UP, UP, and LP bits). When such group identifications are used, one or more of the bits stored in the memory cell (e.g., TP, and XP bits) can be computed from XOR (or XNOR) of the group identification with other bits. Such an arrangement can simplify the reading of multiple bits from the memory cell.

FIGS. 5 and 6 illustrate an example in which each pair of adjacent, closest MLC levels of each group are separated by one MLC level from each of other groups. Such an arrangement can maximize the minimum gap between closest pairs of MLC levels in each group. In general, it is not necessary to interleave the MLC levels of different groups in such a way. When each pair of adjacent MLC levels of each group are sufficiently separately, the MLC levels of each group can be read accurately, even though the threshold distributions of the coarse QLC programming (e.g., as illustrated by curves 251, 253, 255, 257) are too wide to read in QLC mode without the help of the group identification 207.

Figure 7:
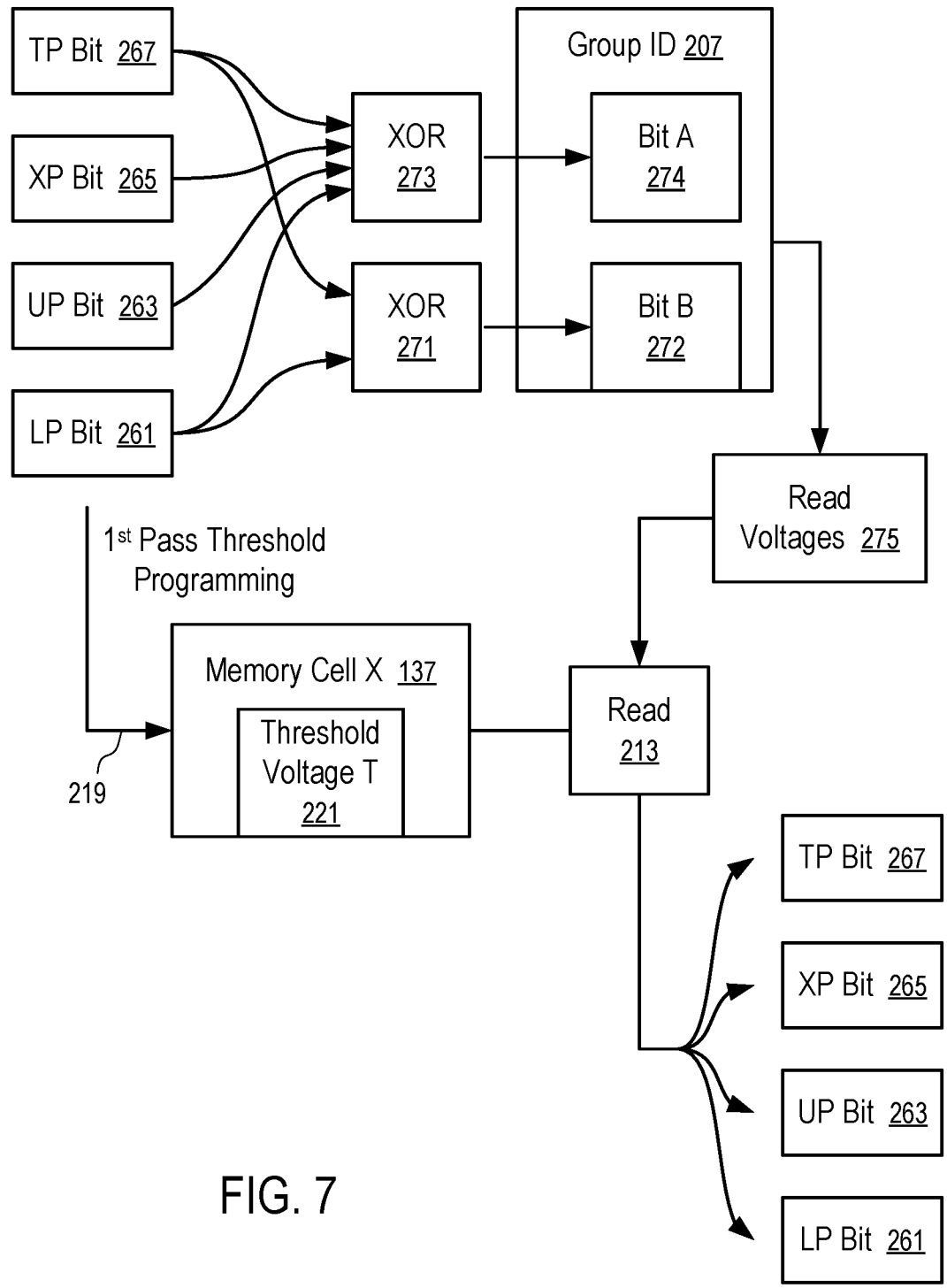
FIG. 7 shows a technique to coarsely program a memory cell to store data in a QLC level and to read the coarsely programmed memory cell according to one embodiment.

FIG. 7 shows a technique to coarsely program a memory cell to store data in a QLC level and to read the coarsely programmed memory cell according to one embodiment.

The technique of FIG. 7 is an example of the use of the technique of FIG. 4. The technique of FIG. 7 can be implemented using the mapping showing in FIG. 6 and the threshold distributions illustrated in FIG. 5.

In FIG. 7, four data bits to be stored in a memory cell 137 are received as LP bit 261, UP bit 263, XP bit 265 and TP bit 267. A logic circuit computes the XOR 273 of the four data bits to generate bit A 274 of a group identification 207 for the memory cell 137; and another logic circuit computes the XOR 271 of the TP bit 267 and the LP bit 261 to generate bit B 272 of the group identification 207 for the memory cell 137.

FIG. 7 illustrates the use of XOR 271 and XOR 273 to compute the group identification 207. Alternatively, XNOR can be used.

When the XOR 271 is used to combine LP bit 261 and TP bit 267 to form bit B 272 of the group identification 207, ECC/LPDC codewords containing the LP bit 261 and the TP bit 267 respective are effectively combined via XOR to generate a valid ECC/LPDC codeword containing the bit B 272. Thus, ECC/LPDC techniques can be used to detect and/or correct errors in reading the bit B 272 of the group identification 207.

Similarly, when the bit A 274 is computed via XOR 273, a valid ECC/LPDC codeword containing the bit A 274 is also generated from the XOR of the codewords containing the LP, UP, XP, and TP bits. ECC/LPDC techniques can be used to detect and/or correct errors in reading the bit A 274 of the group identification 207.

The group identification 207 can be buffered in two memory cells in SLC mode. Alternatively, the group identification 207 can be buffered in a memory cell in MLC mode.

For example, the values of bit A 274 of a page of memory cells being programmed coarsely in QLC mode can be stored/buffered in a page of memory cells in SLC mode; and the values of bit B 272 can be stored/buffered in another page of memory cells in SLC mode. After reading the SLC buffer pages, ECC/LPDC techniques can be applied to codewords in the SLC buffer pages to detect and/or correct errors.

The combination of the values of the LP, UP, XP and TP bits is mapped to a QLC threshold level (e.g., using the table of FIG. 6). The read/write circuit 143 of the memory device 130 can apply coarse programming pulses to move the threshold voltage 221 of the memory cell 137 to a coarse region of threshold distribution.

For example, when the combination of the values of the LP, UP, XP and TP bits corresponds to coarse QLC threshold level $V_0$, the threshold voltage 221 of the memory cell 137 is moved into a region represented by the curve 251. The probability density of the threshold voltage 221 being at a voltage within the region of the curve 251 is the highest at the voltage $V_0$, and reduces when away from the voltage $V_0$.

To read the memory cell 137, the group identification 207 is used to determine the read voltages 275 for testing the threshold level of the memory cell 137. For example, when the memory cell 137 is programmed to threshold level $V_0$ and thus in the group 0, a read voltage between $V_0$ and $V_1$ of Group 0 MLC levels can be used to determine whether the threshold voltage 221 of the memory cell 137 is below the read voltage. For example, the read/write circuit 143 applies the read voltage to the memory cell 137 and determines whether a substantial current passes through the memory cell. If so, the threshold voltage 221 of the memory cell 137 is below the applied read voltage; and the memory cell is determined to be programmed at threshold $V_0$ of Group 0 MLC levels; and the values of the LP, UP, XP and TP bits represented by the threshold level can be determined from the table illustrated in FIG. 6.

If no substantial current passes through the memory cell 137 when the read voltage between $V_0$ and $V_1$ of Group 0 MLC levels is applied, the memory cell 137 is not programmed at the threshold level $V_0$ of Group 0 MLC levels. Thus, further read threshold voltages between $V_1$ and $V_2$ and between $V_2$ and $V_3$ of Group 0 MLC levels can be applied to determine if the threshold voltage of the memory cell 137 is programmed at $V_1$, $V_2$, or $V_3$ of the Group 0 MLC levels.

When the group identification 207 indicates that the threshold voltage 221 is programmed according to group 1, 2, or 3, the corresponding read voltages 275 configured according to Group 1, 2, or 3 MLC levels can be applied to determine the threshold level of the memory cell 137 based on whether the threshold voltage 221 is lower than the read voltages 275.

FIG. 7 shows an example of combining two bits (TP bit 267 and LP bit 261) to generate a bit 272 of the group ID 207. Such a selection can generate optimal results for a Gray code (2-4-4-5) illustrated in FIG. 6. In general, more or less bits can be used to generate a bit of the group ID 207. For example, when another Gray code (3-4-4-4) is used, one bit of the group ID 207 can be computed from XOR of LP, UP and XP bits, and the other from XOR of LP, UP and TP bits. For example, when a further Gray code (3-3-4-5) is used, one bit of the group ID 207 can be computed from XOR of LP, UP and XP bits, and the other from XOR of UP, XP and TP bits. For example, when yet another Gray code is used, one bit of the group ID 207 can be equal to XP; and the other from XOR of LP, UP, XP and TP bits. Thus, the technique is not limited to a combination of bits of a specific number.

Figure 8:
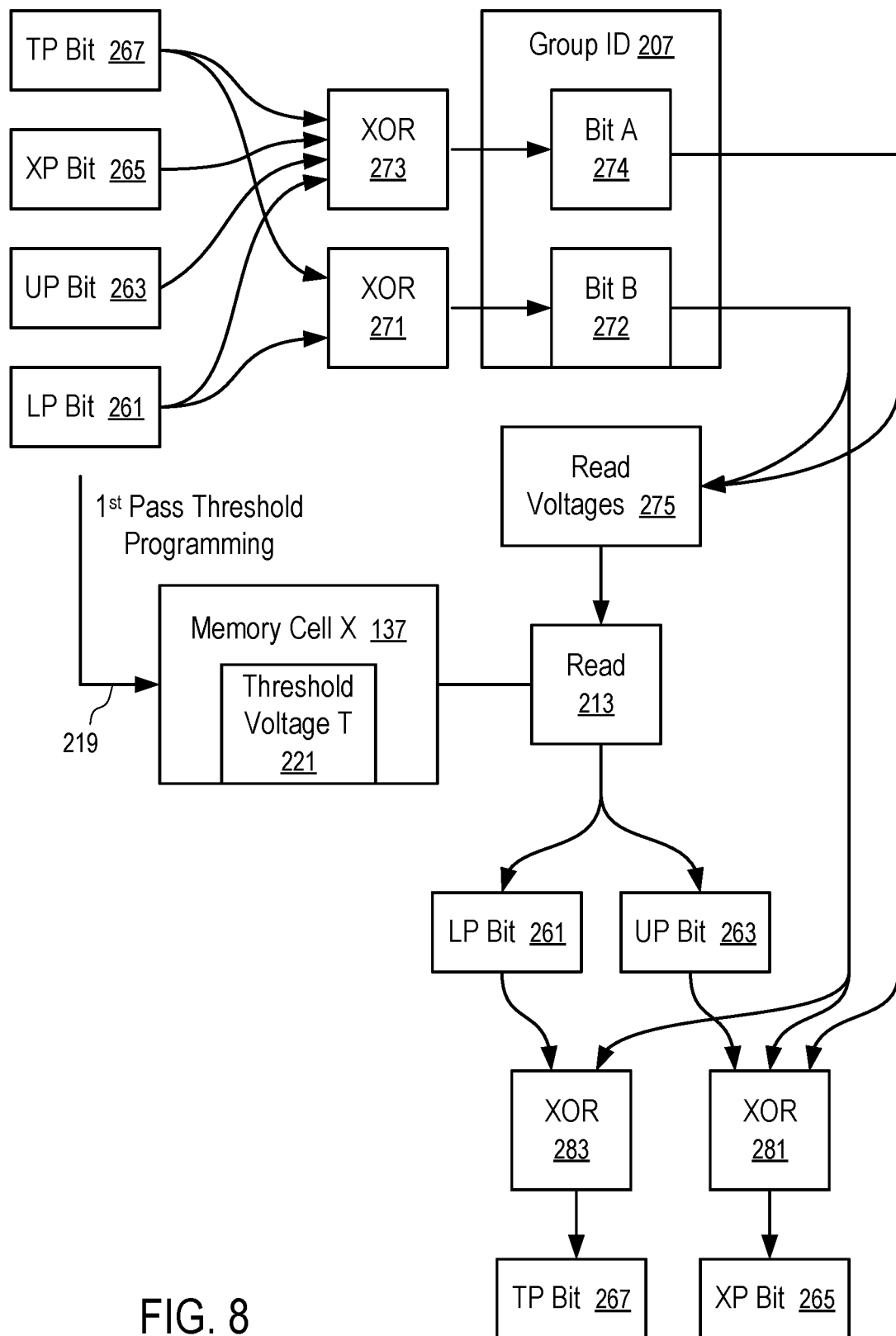
FIG. 8 shows another technique to read the coarsely programmed memory cell according to one embodiment.

FIG. 8 shows another technique to read the coarsely programmed memory cell according to one embodiment.

Similar to the technique of FIG. 7, the technique of FIG. 8 uses XOR 271 and XOR 273 to compute the group identification 207. Alternatively, XNOR can be used.

In addition to the use of group identification 207 to determine the read voltages 275 to read 213 the memory cell 137 in an MLC mode, the bits 272 and 274 of the group identification 207 are used to compute the TP bit 267 and XP bit 265 using XOR 283 and XOR 281.

Since the TP and XP bits can be computed using the LP bit 261, UP bit 263, and the group identification 207, the operation to read 213 the memory cell 137 can be simplified by reading LP and UP bits of the four bits.

FIG. 8 illustrates an example of computing TP and XP bits using the group identification 207. Alternatively, LP and/or UP bits can be computed based on TP and/or XP bits. For example, LP bit 261 can be computed from the XOR of the TP bit and bit B 272 of the group identification 207; and UP bit 263 can be computed from the XOR of the XP bit 265 and bits 272 and 274 of the group identification 207.

Figure 9:
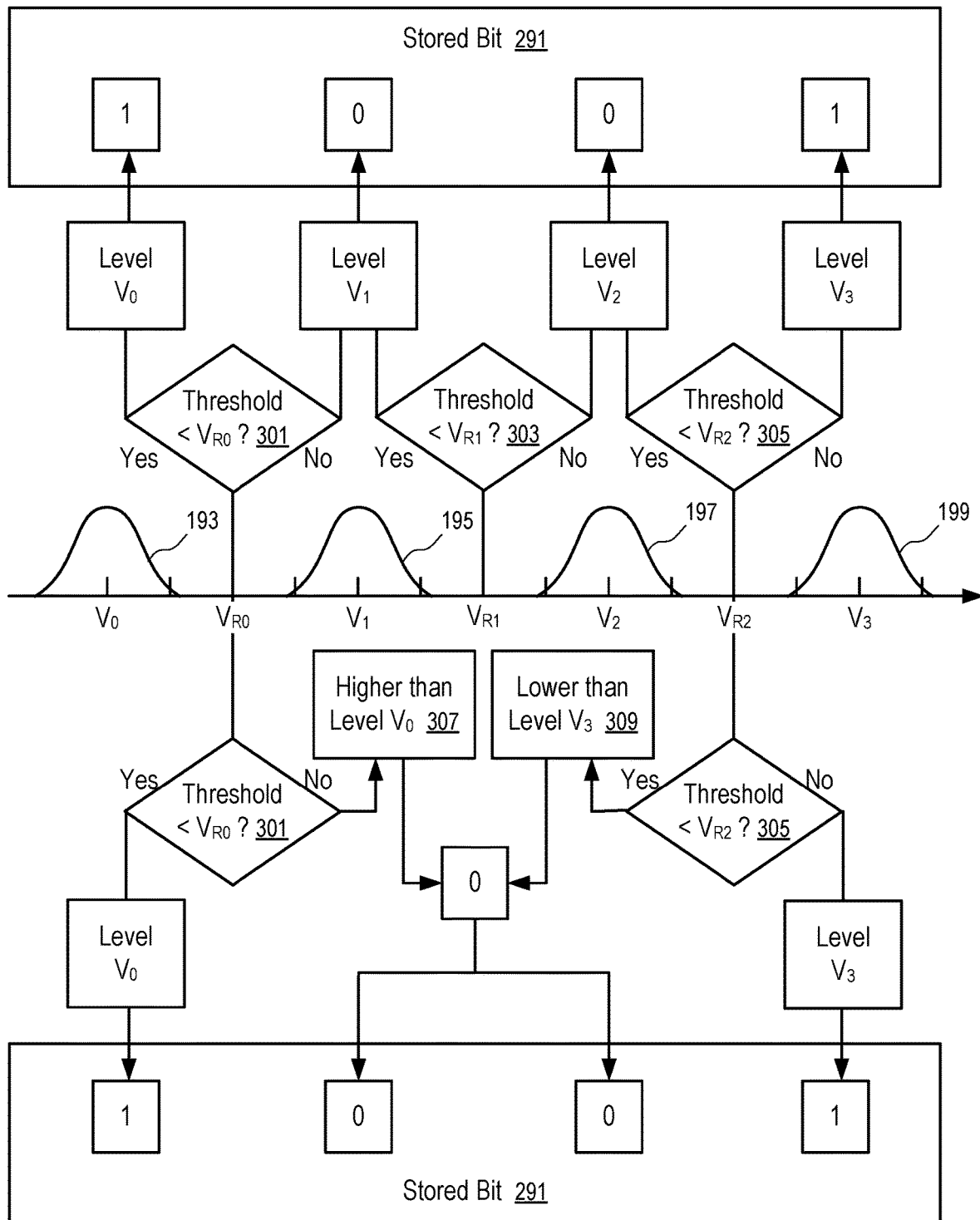
FIG. 9 shows techniques to determine the value of a bit stored in a memory cell coarsely programmed in a group of predefined threshold levels according to one embodiment.

FIG. 9 shows techniques to determine the value of a bit stored in a memory cell coarsely programmed in a group of predefined threshold levels according to one embodiment.

For example, the techniques of FIG. 9 can be used to read a memory cell 137 programmed to a threshold level in group 0, 1, 2, or 3 MLC levels illustrated in FIG. 5.

In FIG. 9, curves 193, 195, 197 and 199 represent the probability distributions of the threshold voltage 221 of a memory cell 137 after programming at threshold levels $V_0$, $V_1$, $V_2$ and $V_3$ respectively.

Read voltages $V_{R0}$, $V_{R1}$ and $V_{R2}$ are configured between the adjacent threshold distribution curves 193, 195, 197 and 199. The read/write circuit 143 of the memory device 130 can apply a read voltage (e.g., $V_{R0}$, $V_{R1}$ or $V_{R2}$) to the memory cell 137 and sense whether a substantial current (e.g., higher than a threshold) goes through the memory cell 137. If so, the threshold voltage 221 of the memory cell 137 is lower than the applied read voltage (e.g., $V_{R0}$, $V_{R1}$ or $V_{R2}$).

In block 301, when the threshold voltage 221 of the memory cell 137 is found to be lower than the read voltage $V_{R0}$, the threshold voltage 221 of the memory cell 137 is seen to be programmed to level $V_0$, which represents that the stored bit 291 in the memory cell 137 has a first value associated with level $V_0$ (e.g., 1 in the example illustrated in FIG. 9). Otherwise, in block 303, when the threshold voltage 221 of the memory cell 137 is found to be lower than the read voltage $V_{R1}$, the threshold voltage 221 of the memory cell 137 is seen to be programmed to level $V_1$, which represents that the stored bit 291 in the memory cell 137 has a second value associated with level $V_1$ (e.g., 0 in the example illustrated in FIG. 9). Otherwise, in block 305, when the threshold voltage 221 of the memory cell 137 is found to be lower than the read voltage $V_{R2}$, the threshold voltage 221 of the memory cell 137 is seen to be programmed to level $V_2$, which represents that the stored bit 291 in the memory cell 137 has a third value associated with level $V_2$ (e.g., 0 in the example illustrated in FIG. 9). Otherwise, the threshold voltage 221 of the memory cell 137 is seen to be programmed to level $V_3$, which represents that the stored bit 291 in the memory cell 137 has a fourth value associated with level $V_3$ (e.g., 1 in the example illustrated in FIG. 9).

When the mapping between the levels $V_0$, $V_1$, $V_2$, and $V_3$ and their respective values are known, it can be possible to skip the operation of current sensing at some of the read voltages.

In the example illustrated in FIG. 9, the levels $V_1$ and $V_2$ both are used to represent a same value of zero. The threshold voltage 221 of the memory cell 137 being programmed at consecutive $V_1$ or $V_2$ provides the same value of zero for the stored bit 291. Thus, it is not necessary to separately test whether the memory cell 137 is programmed at $V_1$ or $V_2$; and the sensing at read voltage $V_{R1}$ can be skipped. When the current sensing at read voltage $V_{R0}$ indicates at block 301 that the threshold voltage 221 of the memory cell 137 is higher than $V_{R0}$, the conclusion 307 can be made that the threshold level of the memory cell 137 is higher than $V_0$. When the current sensing at read voltage $V_{R2}$ indicates at block 305 that the threshold voltage 221 of the memory cell 137 is lower than $V_{R2}$, the conclusion 309 can be made that the threshold level of the memory cell 137 is lower than $V_3$. From the conclusions 307 and 309 it can be determined that the memory cell 137 is programmed at either $V_1$ or $V_2$. Since both threshold levels $V_1$ and $V_2$ represent the same value of zero, the value of the stored bit 291 can be determined without ambiguity.

In general, it is sufficient to perform sensing at read voltages that separate a pair of adjacent, closest threshold levels representing different values. The value of the stored bit 291 can be initially assumed and set to have the value (e.g., 1) represented by the lowest level $V_0$. The smallest read voltage (e.g., $V_{R0}$) that separates levels (e.g., $V_0$ and $V_1$) representing different values (e.g., 1 and 0) can be applied to the memory cell 137. When a current passing the memory cell 137 at the read voltage (e.g., $V_{R0}$) is sensed to be above a threshold, the assumed value for the stored bit 291 is correct; otherwise, the assumed value is inverted to be the value (e.g., 0) represented by the next level (e.g., $V_1$) that is immediately above the read voltage (e.g., $V_{R0}$). Such sensing operations can be repeated at increasingly higher read voltages that separate levels representing different bit values until the value of the stored bit 291 is determined.

FIG. 9 illustrates an example of mapping between the values of the stored bit 291 and the threshold levels $V_0$, $V_1$, $V_2$, and $V_3$ that corresponds to the mapping between the values of LP bit and the Group 0 MLC levels. The techniques of FIG. 9 can be similarly applied to mapping between the values of UP bit (XP bit, or TP bit) and the Group 1 (2 or 3) MLC levels.

Figure 10:
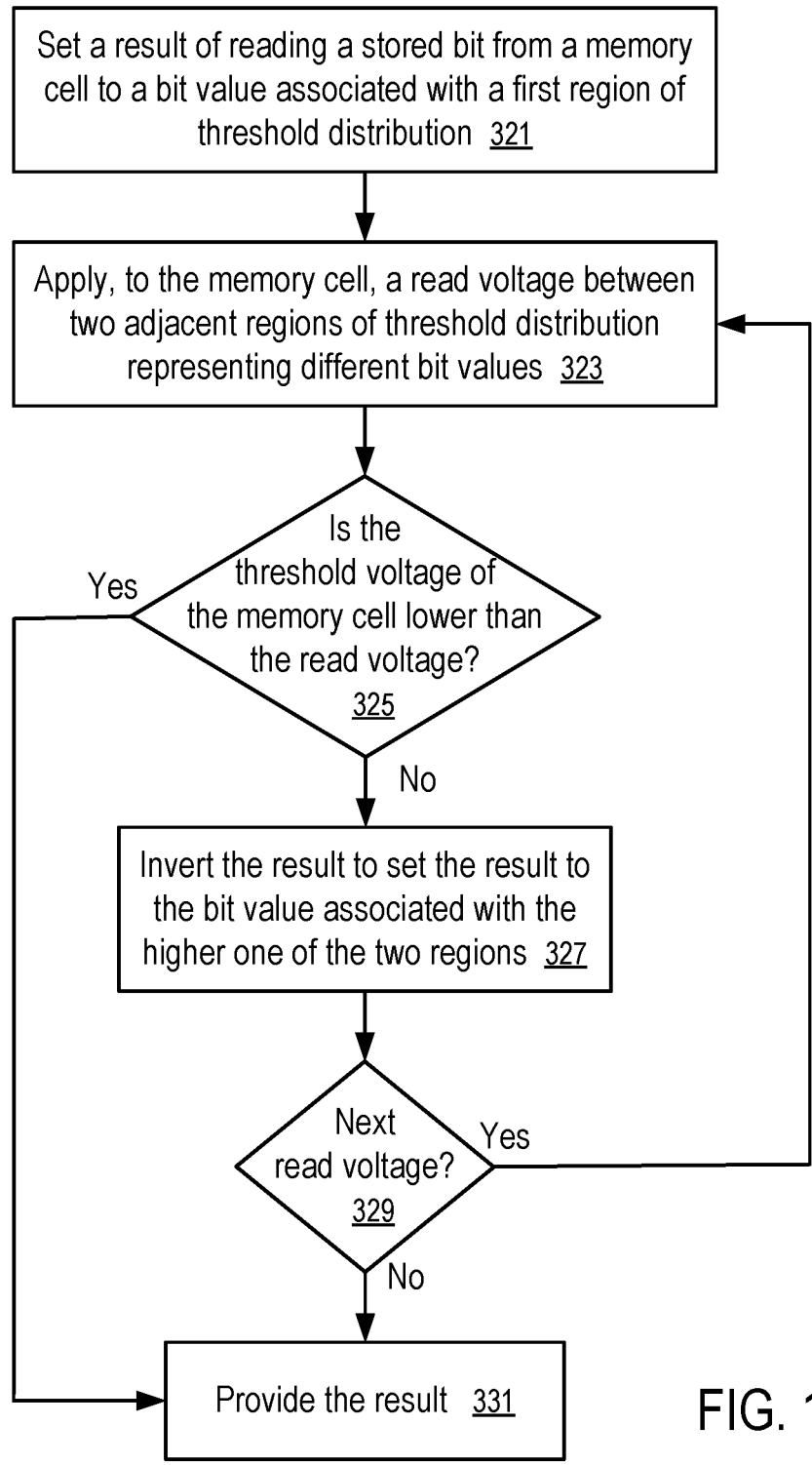
FIG. 10 shows a method to read a memory cell coarsely programmed in a group of predefined threshold levels according to one embodiment.

FIG. 10 shows a method to read a memory cell coarsely programmed in a group of predefined threshold levels according to one embodiment. For example, the method of FIG. 10 can be performed by a read/write circuit 143 of the memory device 130 using a technique discussed above in connection with FIG. 9.

At block 321, a memory device 130 sets a result of reading a stored bit 291 from a memory cell to a bit value (e.g., 1) associated with a first region of threshold distribution (e.g., represented by the distribution curve 193).

At block 323, the memory device 130 applies, to the memory cell 137, a read voltage (e.g., $V_{R0}$) between two adjacent regions of threshold distribution (e.g., represented by the distribution curves 193 and 195) representing different bit values (e.g., 1 and 0).

At block 325, the memory device 130 determines whether the threshold voltage 221 of the memory cell 137 is lower than the read voltage (e.g., $V_{R0}$). For example, the current passing through the memory cell 137 at the read voltage (e.g., $V_{R0}$) is compared to a threshold. If the current is larger than the threshold, the threshold voltage 221 of the memory cell 137 is lower than the read voltage (e.g., $V_{R0}$); and the value of the stored bit 291 is identified. At block 331, the memory device 130 provides the result as the value of the stored bit 291.

If the threshold voltage 221 of the memory cell 137 is higher than the read voltage (e.g., $V_{R0}$), at block 327 the memory device 130 inverts the result to set the result to the bit value (e.g., 0) associated with the higher one of the two regions (e.g., represented by the distribution curve 195).

At block 329, the memory device 130 determines whether there is a next read voltage (e.g., $V_{R2}$) that separates two adjacent regions of threshold distribution (e.g., represented by the distribution curves 197 and 199) representing different bit values (e.g., 0 and 1). If so, operations in blocks 323 to 329 can be repeated for the next read voltage (e.g., $V_{R2}$).

In general, a memory cell group (e.g., 131) have different memory cells (e.g., 137, ..., 139) that are programmed to different ones of the groups 0, 1, 2, and 3 MLC levels. It is possible to read memory cells in group 0, and the memory cells in group 1, etc., sequentially. However, such an arrange can result in overhead in spending time ramping up voltages to reach read voltages of the respective groups 0, 1, 2 and 3.

To reduce the overhead, the read voltages of groups 0, 1, 2 and 3 can be stacked, interleaved, and arranged in an increase order such that the memory device 130 can stepwise increase the voltage applied to a group of memory cells (e.g., 137, ..., 139) to various read voltages, from the lowest voltage one to the highest read voltages. When a read voltage of a particular group (e.g., group 0 MLC levels) is applied, the result of each memory cell belong to the group can be updated according to the sensing of the current passing through the memory cell, as illustrated in FIG. 11.

Figure 11:
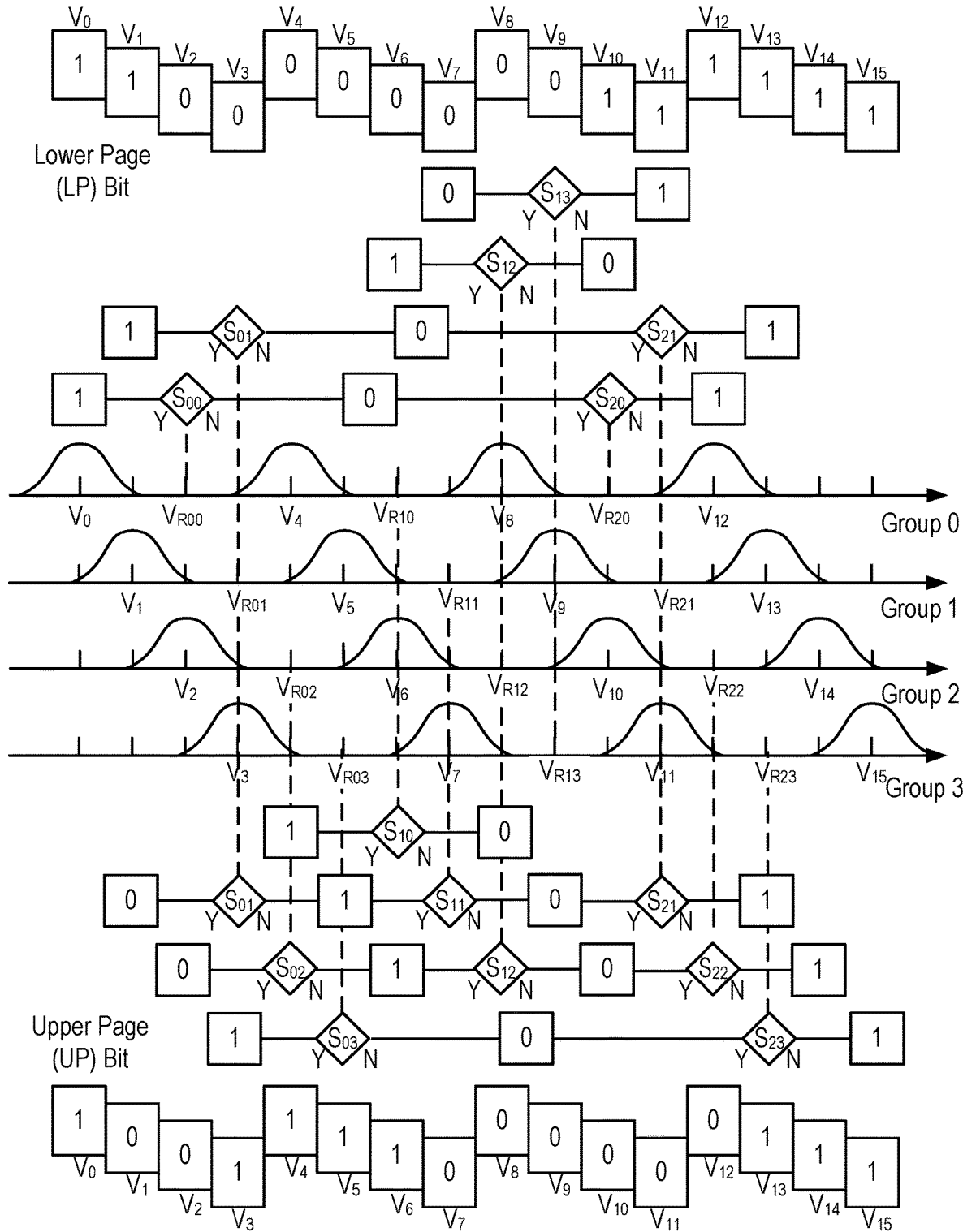
FIG. 11 illustrates a technique to read two bits of a memory cell coarsely programmed in a QLC mode according to one embodiment.

FIG. 11 illustrates a technique to read two bits of a memory cell coarsely programmed in a QLC mode according to one embodiment.

The example illustrated in FIG. 11 uses the mapping of LP and UP bits shown in FIG. 6. The QLC voltage levels $V_0$ to $V_{15}$ are mapped to the respective values of the LP and UP bits.

For a memory cell in Group 0, read voltages $V_{R00}$, $V_{R10}$ and $V_{R20}$ are used to determine the bit values for the LP bit and UP bit stored in the memory cell.

For a memory cell in Group 1, read voltages $V_{R01}$, $V_{R11}$ and $V_{R21}$ are used to determine the bit values for the LP bit and UP bit stored in the memory cell.

For a memory cell in Group 2, read voltages $V_{R02}$, $V_{R12}$ and $V_{R22}$ are used to determine the bit values for the LP bit and UP bit stored in the memory cell.

For a memory cell in Group 3, read voltages $V_{R03}$, $V_{R13}$ and $V_{R23}$ are used to determine the bit values for the LP bit and UP bit stored in the memory cell.

The read voltages of Groups 0, 1, 2 and 3 can be stacked and interleaved in an increasing order (e.g., $V_{R00}$, $V_{R01}$, $V_{R02}$, $V_{R03}$, $V_{R10}$, $V_{R11}$, ..., $V_{R23}$) such that the memory device 130 applies the read voltages one after another with increasing read voltages to minimize the time overhead in setting the read voltages.

Values of the LP bit for memory cells in groups 0, 1, 2, and 3 are initially set to the values 1, 1, 0, and 0 associated with the lowest threshold levels of groups 0, 1, 2, and 3 respectively (e.g., QLC levels $V_0$, $V_1$, $V_2$, and $V_3$).

Values of the UP bit for memory cells in groups 0, 1, 2, and 3 are initially set to the values 1, 0, 0, and 1 associated with or the lowest threshold levels of groups 0, 1, 2, and 3 respectively (e.g., QLC levels $V_0$, $V_1$, $V_2$, and $V_3$).

When the read voltage $V_{R00}$ is applied to the memory cell group 131, the current going through each Group 0 memory cell is sensed. If the threshold voltage of the sensed memory cell is lower than the applied read voltage $V_{R00}$, the assumed bit value of 1 programmed at $V_0$ is confirmed; and no further update to the LP bit value is performed. Optionally, further sensing at one or more higher read voltages (e.g., $V_{R20}$) can be performed; however, since the threshold voltage of the sensed memory cell will be again confirmed to be lower than the applied read voltage (e.g., $V_{R20}$), no further update to the assumed value will be made. Otherwise, if the threshold voltage of the sensed memory cell is higher than the applied read voltage $V_{R00}$, the assumed bit value for the sensed memory cell is inverted to 0, corresponding to the value of 0 associated with next levels $V_4$ and $V_8$ for Group 0 memory cells; and the LP bit value of the Group 0 memory cell will not be updated or confirmed until the read voltage $V_{R20}$ is applied.

Since the value of UP bit remains the same for $V_0$ and $V_4$, no operation is necessary/performed in response to sensing the Group 0 memory cell at the read voltage $V_{R00}$.

Subsequently, the memory device 130 increases the voltage applied to the memory cell group 131 to $V_{R01}$ for Group 1. The current going through each Group 1 memory cell is sensed; and the assumed LP bit for sensed memory cell can be confirmed or inverted based on the current sensing result at the read voltage $V_{R01}$. Since the Group 1 memory cell can have different values for its UP bit for being programmed at $V_1$ that is below the read voltage $V_{R01}$ and at $V_5$ that is above the read voltage $V_{R01}$, the assumed UP bit for the sensed memory cell can also be confirmed or inverted based on the current sensing result at the read voltage $V_{R01}$. Thus, the result of current sensing performed for a Group 1 memory cell at read voltage $V_{R01}$ can be used to confirm or invert both its LP bit and UP bit.

Subsequently, the memory device 130 increases the voltage applied to the memory cell group 131 to $V_{R02}$ for Group 2. Since the value of LP bit remains the same for threshold voltages across $V_{R02}$, no operation is performed in response to sensing the Group 2 memory cell at the read voltage $V_{R02}$. However, the value of UP bit changes from having threshold voltages below $V_{R02}$ to having threshold voltages above $V_{R02}$, the assumed UP bit for the sensed memory cell can be confirmed or inverted based on the current sensing result at the read voltage $V_{R02}$.

Subsequently, the memory device 130 increases the voltage applied to the memory cell group 131 to $V_{R03}$ for Group 3. Since the value of LP bit remains the same for threshold voltages across $V_{R03}$, no operation is performed in response to sensing the Group 3 memory cell at the read voltage $V_{R02}$. However, the value of UP bit changes from having threshold voltages below $V_{R03}$ to having threshold voltages above $V_{R03}$, the assumed UP bit for the sensed memory cell can be confirmed or inverted based on the current sensing result at the read voltage $V_{R03}$.

In a similar way, when the memory device 130 increases the voltage applied to the memory cell group 131 to $V_{R10}$, $V_{R11}$, $V_{R12}$ and $V_{R13}$ for Groups 0, 1, 2 and 3 respectively, the assumed LP value is confirmed or inverted based on the current sensing result at $V_{R12}$ and $V_{R13}$ for Group 2 and Group 3 memory cells respectively; and the assumed UP value is confirmed or inverted based on the current sensing result at $V_{R10}$, $V_{R11}$ and $V_{R12}$ for Group 0, Group 1 and Group 2 memory cells respectively.

Subsequently, when the memory device 130 increases the voltage applied to the memory cell group 131 to $V_{R20}$, $V_{R21}$, $V_{R22}$ and $V_{R23}$ for Groups 0, 1, 2 and 3 respectively, the assumed LP value is confirmed or inverted based on the current sensing result at $V_{R20}$ and $V_{R21}$ for Group 0 and Group 1 memory cells respectively; and the assumed UP value is confirmed or inverted based on the current sensing result at $V_{R21}$, $V_{R22}$ and $V_{R23}$ for Group 1, Group 2 and Group 3 memory cells respectively.

FIG. 11 illustrates an example of reading LP and UP bits. After the LP and UP bits are determined, XP and TP bits can be computed from the LP and UP bits and the group identification 207, as illustrated in FIG. 8.

In some instances, a request is received to retrieve one of the data groups 151, 157, ..., 159 that corresponds to the values of the LP bit of the memory cells 137, ..., 139 in the memory cell group 131. In response to such a request, the operations related to the reading of UP bit can be skipped. For example, sensing current at read voltages $V_{R02}$, $V_{R03}$, $V_{R11}$, $V_{R22}$, and $V_{R23}$ can be skipped, since the sensing results are used in the determination of the UP bit but not in the determination of the LP bit.

Similarly, in response to a request for the values of the UP bit of the memory cells 137, ..., 139 in the memory cell group 131, the operations related to the reading of the LP bit but not related to the reading of the UP bit can be skipped.

Further, TP and/or XP bits can be read (e.g., assumed, confirmed, inverted) in a similar way by based on the results of sensing current at the read voltages applied at the read voltages $V_{R00}$, $V_{R01}$ $V_{R02}$, $V_{R03}$, $V_{R10}$, ..., $V_{R22}$, and $V_{R23}$. For example, a request can be made to retrieve the TP values of a page of memory cells without LP, UP, XP values. Thus, the current sensing at some of the read voltages (e.g., $V_{R10}$, $V_{R11}$) can be skipped.

Figure 12:
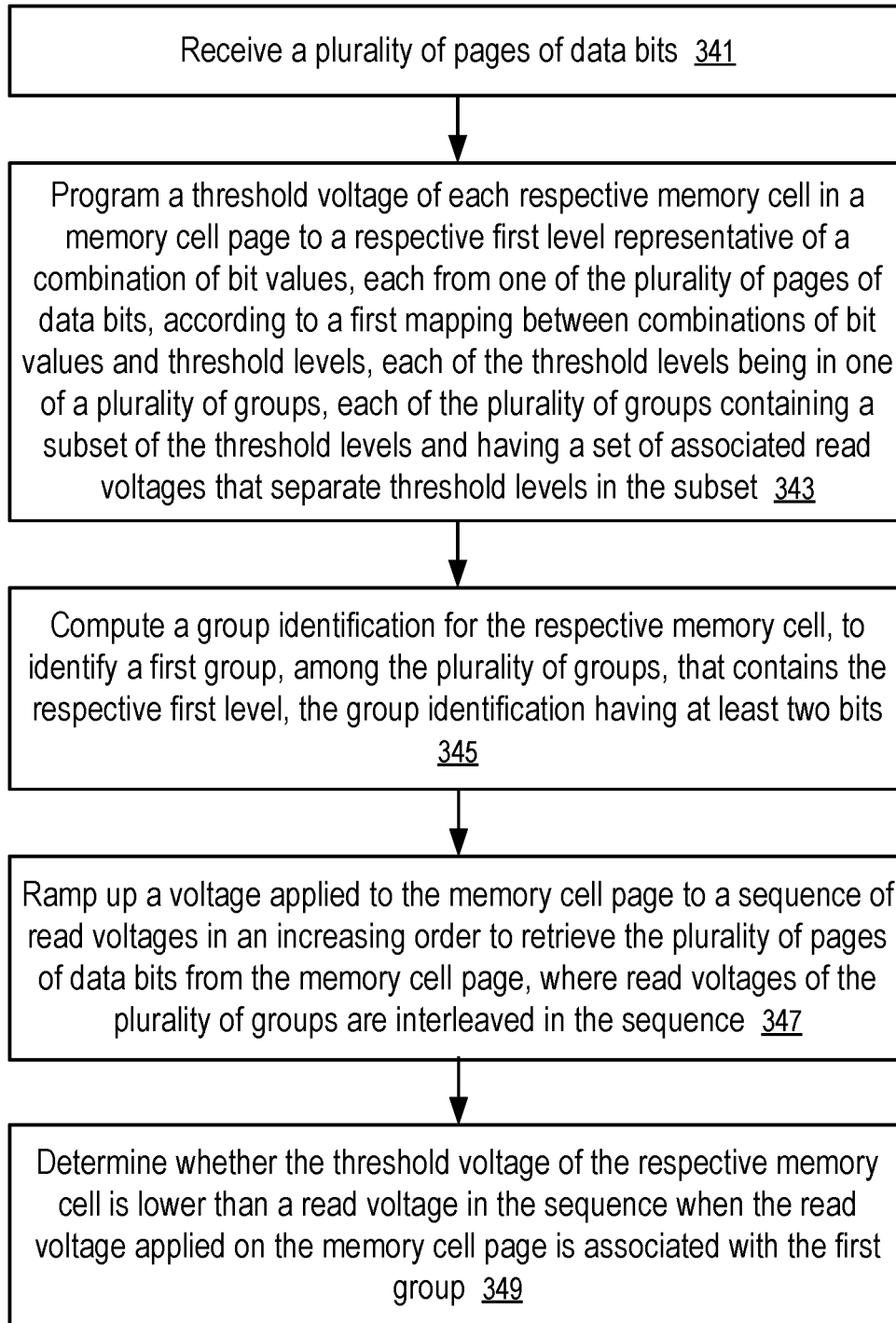
FIG. 12 shows a method of two-pass programming of memory cells according to some embodiments.

FIG. 12 shows a method of two-pass programming of memory cells according to some embodiments. The methods of FIG. 12 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 12 is performed at least in part by the controller 150 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 12 can be implemented in the programming manager 113 of the memory device 130 and/or the memory sub-system 110.

At block 341, the programming manager 113 receives a plurality of pages of data bits. For example, the controller 115 of the memory sub-system 110 can send a write command with four pages of data to be stored in a page of memory cells in a memory device 130. The memory device 130 can place the four pages in latches 145 to facilitate the programming of four bits of data in each memory cell in the page of memory cells.

At block 343, the programming manager 113 instructs the read/write circuit 143 to coarsely program a threshold voltage of each respective memory cell (e.g., 137) in a memory cell page to a respective first level 203 representative of a combination of bit values of data bits 161, 163, ..., 165, each from one of the plurality of pages of data bits. The first level 203 is representative of the combination according to a first mapping 201 between combinations of bit values and threshold levels. Each of the threshold levels is in one of a plurality of groups; and each of the plurality of groups contains a subset of the threshold levels and has a set of associated read voltages that separate threshold levels in the subset.

For example, when four pages of data bits are received for storing in a page of memory cells, the data bits 161, 163, ..., 165 can be LP bit 261, UP bit 263, XP bit 265, and TP bit 267; and the first mapping 201 can be according to a table illustrated in FIG. 6 to store data in the respective memory cell 137 in quad-level cell (QLC) mode.

For example, the threshold levels can be partitioned into the groups such that between each pair of closest threshold levels in each respective group in the plurality of groups, there are threshold levels each in one of the plurality of groups other than the respective group, as illustrated in FIG. 5 and FIG. 6. The threshold levels of different groups are interleaved; and the read voltages of the groups are interleaved as illustrated in FIG. 12.

At block 345, the programming manager 113 computes a group identification 207 for the respective memory cell 137 to identify a first group, among the plurality of groups, that contains the respective first level. The group identification can have at least two bits for partition the threshold levels into a large number of groups and thus reduce the number of threshold levels in the first group and the precision requirement for coarsely programming the respective memory cell 137 while allowing the data stored in the coarsely programmed respective memory cell 137 to be read.

For example, a first bit 272 of the two bits of the group identification 207 can be computed from applying the logic operation to two (e.g., LP bit 261 and TP bit 267) of the data bits (e.g., LP bit 261, UP bit 263, XP bit 265, and TP bit 267). A second bit 274 of the two bits of the group identification 207 can be computed from applying the logic operation to the data bits (e.g., LP bit 261, UP bit 263, XP bit 265, and TP bit 267), as illustrated in FIG. 6, FIG. 7, and FIG. 8.

Alternatively, the group identification 207 can be calculated from the QLC threshold level numbers 0, 1, 2, ..., 15.

To read 213 the data bits (e.g., LP bit 261, UP bit 263, XP bit 265, and TP bit 267) back from the respective memory cell 137 into latches 145, the memory device 130 can determine a subset (e.g., LP bit 261 and UP bit 263) of the data bits from testing the threshold voltage 221 of the respective memory cell 137 at read voltages identified according to the group identification. For example, read voltages $V_{R00}$, $V_{R10}$ and $V_{R20}$ are used for group 0, read voltages $V_{R01}$, $V_{R11}$ and $V_{R21}$ for group 1, read voltages $V_{R02}$, $V_{R12}$ and $V_{R22}$ for group 2, and read voltages $V_{R03}$, $V_{R13}$ and $V_{R23}$ for group 3. From the subset (e.g., LP bit 261 and UP bit 263) and the group identification 207, the memory device 130 can compute the values of at least two of the data bits. For example, when the group identification 207 has bits 272 and 274, the TP bit 267 and XP bit 265 can be computed from the group identification 207 and the remaining bits read 213 from the respective memory cell 137.

When data groups 151, 157, ..., 159 of are coarsely programmed in a memory cell group 131, the group identification (e.g., 207) of each memory cell (e.g., 137) in the memory cell group 131 identifies the threshold level subset that contains the first level 203 of the respective memory cell (e.g., 137). On the other hand, a given group identifications (e.g., 207) identifies a subset of memory cells (e.g., 137) in the memory cell group 131 that are coarsely programmed to the threshold levels represented by the corresponding threshold level group.

The memory device 130 can buffer the group identification 207 in at least two second memory cells in single level cell (SLC) mode. To read the coarsely programmed memory cell 137, the memory device 130 reads the at least two second memory cells in SLC mode to retrieve the group identification 207 prior to the fine threshold programming 229 of the threshold voltage 225 of the memory cell 137.

At block 347, the programming manager 113 instructs the read/write circuit 143 to ramp up a voltage applied to the memory cell page to a sequence of read voltages in an increasing order to retrieve the plurality of pages of data bits from the memory cell page, where read voltages of the plurality of groups are interleaved in the sequence.

Since the read voltages from the different groups are interleaved and arrange in an increasing order for sequential application to the memory cell page, the waveform of the voltage applied to the memory cell page resembles a ladder. The voltage increases over time and is held level at each read voltage for a period of time during which sensing of whether the threshold voltage 221 of the respective memory cell 137 is higher than the read voltage is performed.

Some of the read voltages in the sequence is not relevant to the reading of the respective memory cell 137 and/or for some of the data pages, but can be used to read other memory cells in the memory cell page that have group identifications different from the group identification 207 of the memory cell 137.

At block 349, the programming manager 113 instructs the read/write circuit 143 to determine whether the threshold voltage 221 of the respective memory cell 137 is lower than a read voltage in the sequence when the read voltage applied on the memory cell page is associated with the first group, as identified by the group identification 207 of the memory cell 137.

For example, whether the threshold voltage 221 of the respective memory cell 137 is lower than the read voltage in the sequence can be determined by sensing whether a current passing through the respective memory cell 137 subjected to the read voltage is above a threshold.

For example, as the initial assumption, the bits of the number of data pages to be read from the memory cell page can be set/initialized to the values represented by the lowest threshold levels in groups identified by the group identifications of the memory cells.

In response to a determination that the threshold voltage 221 of the respective memory cell 137 is lower than the read voltage associated with the first group of the respective memory, the value of a bit in each of at least two pages of data bits as being read back from the memory cell page can be set, confirmed, accepted, finalized to prevent further changes at subsequent read voltages of the first group.

In response to a determination that the threshold voltage 221 of the respective memory cell 137 is higher than the read voltage associated with the first group of the respective memory, the value of a bit in each of at least two pages of data bits assumed to be read back from the memory cell page can be inverted/updated as the updated assumption.

After retrieving the data bits 161, 163, . . . , 165 back from the respective memory cell 137 into the latches 145, the programming manager 113 instructs the read/write circuit 143 to finely program the threshold voltage 225 of the respective memory cell 137 to a second level 223 representative of the combination of values of the data bits obtained from the reading of the respective memory cell 137, according to a second mapping 217 between combinations of values of bits and threshold levels.

Optionally, the second mapping 217 can be the same as the first mapping 201; and the second level 223 is the same as the first level 203. The second-pass threshold programming 229 is performed to reduce the width of region of threshold distribution such that the respective memory cell 137 can be read according to the second mapping 217 without the help of the group identification 207. After the second-pass threshold programming 229, the group identification 207 can be discarded.

Figure 13:
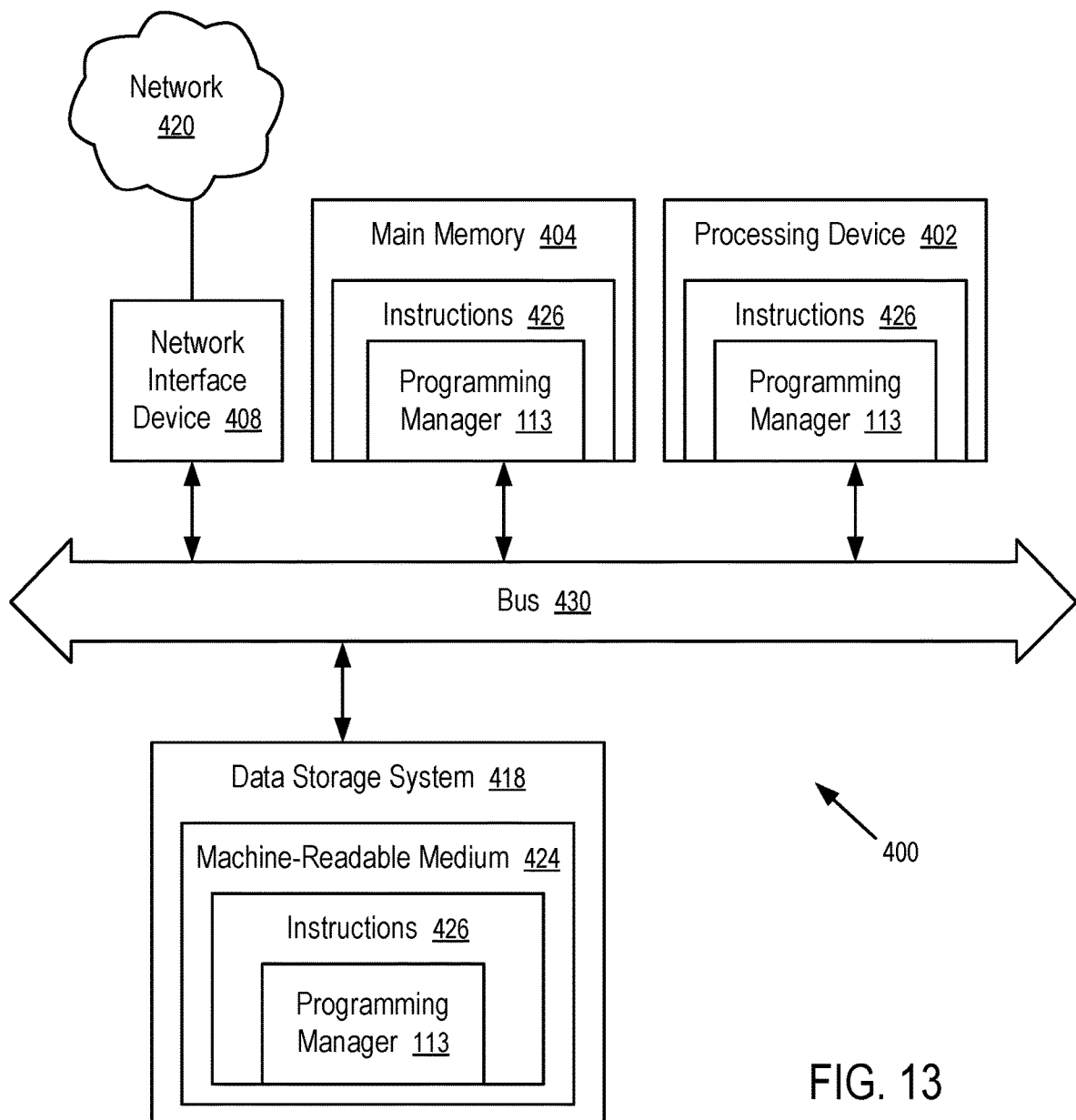
FIG. 13 is a block diagram of an example computer system in which embodiments of the present disclosure can operate.

FIG. 13 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a programming manager 113 (e.g., to execute instructions to perform operations corresponding to the programming manager 113 described with reference to FIGS. 1-12). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a programming manager 113 (e.g., the programming manager 113 described with reference to FIGS. 1-12). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
memory cells; and
a logic circuit coupled with the memory cells and configured to:
receive a plurality of pages of data bits; and
program a page of the memory cells to have threshold voltages representative of the plurality of pages of data bits, via:
programming, in a first pass, a threshold voltage of each respective memory cell in the page of the memory cells to a respective first level representative of a combination of bit values, each of the bit values being from one of the plurality of pages of data bits;

computing a group identification for the respective memory cell; and increasing a voltage applied to the page of the memory cells to a sequence of read voltages in an increasing order to retrieve the plurality of pages of data bits from the page of the memory cells.

2. The device of claim 1, wherein the threshold voltage is programmed in the first pass according to a first mapping between combinations of bit values and threshold levels, each of the threshold levels being in one of a plurality of groups, each of the plurality of groups containing a subset of the threshold levels and having a set of associated read voltages that separate threshold levels in the subset.

3. The device of claim 2, wherein the group identification is configured to identify a first group, among the plurality of groups, containing the respective first level.

4. The device of claim 3, wherein the group identification has at least two bits;

and wherein read voltages of the plurality of groups are interleaved in the sequence.

5. The device of claim 4, wherein the logic circuit is configured to program the page of the memory cells further via setting a value of a bit in each of at least two pages in the plurality of pages of data bits in response to a determination that the threshold voltage of the respective memory cell is lower than the read voltage.

6. The device of claim 4, wherein the logic circuit is configured to program the page of the memory cells further via initializing a bit, in a respective page in the plurality of pages of data bits, to have a value represented by a lowest threshold level in the first group for the respective page.

7. The device of claim 6, wherein the logic circuit is configured to program the page of the memory cells further via inverting the value for the bit in response to a determination that the threshold voltage of the respective memory cell is higher than the read voltage.

8. The device of claim 6, wherein the logic circuit is configured to program the page of the memory cells further via accepting the value as being stored in the respective memory cell for the bit to prevent further changes at subsequent read voltages, in response to a determination that the threshold voltage of the respective memory cell is lower than the read voltage.

9. The device of claim 8, wherein between each pair of closest threshold levels in each respective group in the plurality of groups, there are threshold levels each in one of the plurality of groups other than the respective group; and wherein the logic circuit is configured to program the page of the memory cells further via programming the threshold voltage of the respective memory cell in the memory cell page to a respective second level representative of the combination of bit values, according to a second mapping between combinations of bit values and threshold levels.

10. The device of claim 9, wherein the first mapping and the second mapping are configured to program the voltage threshold of the respective memory cell to store data in quad-level cell (QLC) mode.

11. The device of claim 9, wherein the second mapping is same as the first mapping; and the second level is equal to the first level.

12. A method, comprising:

receiving, in a memory device having memory cells, a plurality of pages of data bits; and programming a page of the memory cells to have threshold voltages representative of the plurality of pages of data bits, via:

programming, in a first pass, a threshold voltage of each respective memory cell in the page of the memory cells to a respective first level representative of a combination of bit values, each of the bit values being from one of the plurality of pages of data bits;

computing a group identification for the respective memory cell; and increasing a voltage applied to the page of the memory cells to a sequence of read voltages in an increasing order to retrieve the plurality of pages of data bits from the page of the memory cells.

13. The method of claim 12, wherein the threshold voltage is programmed in the first pass according to a first mapping between combinations of bit values and threshold levels, each of the threshold levels being in one of a plurality of groups, each of the plurality of groups containing a subset of the threshold levels and having a set of associated read voltages that separate threshold levels in the subset;

wherein the group identification is configured to identify a first group, among the plurality of groups, containing the respective first level;

wherein the group identification has at least two bits; and wherein read voltages of the plurality of groups are interleaved in the sequence.

14. The method of claim 13, wherein the programming of the page further includes setting a value of a bit in each of at least two pages in the plurality of pages of data bits in response to a determination that the threshold voltage of the respective memory cell is lower than the read voltage.

15. The method of claim 13, wherein the programming of the page further includes initializing a bit, in a respective page in the plurality of pages of data bits, to have a value represented by a lowest threshold level in the first group for the respective page.

16. The method of claim 15, wherein the programming of the page further includes inverting the value for the bit in response to a determination that the threshold voltage of the respective memory cell is higher than the read voltage.

17. The method of claim 15, wherein the programming of the page further includes accepting the value as being stored in the respective memory cell for the bit to prevent further changes at subsequent read voltages, in response to a determination that the threshold voltage of the respective memory cell is lower than the read voltage;

wherein between each pair of closest threshold levels in each respective group in the plurality of groups, there are threshold levels each in one of the plurality of groups other than the respective group; and wherein the programming of the page further includes programming the threshold voltage of the respective memory cell in the memory cell page to a respective second level representative of the combination of bit values, according to a second mapping between combinations of bit values and threshold levels.

18. The method of claim 17, wherein the first mapping and the second mapping are configured to program the voltage threshold of the respective memory cell to store data in quad-level cell (QLC) mode.

19. A memory sub-system, comprising:
a processing device; and
a memory device having memory cells and configured to:
  receive, from the processing device, a plurality of pages of data bits; and
  program a page of the memory cells to have threshold voltages representative of the plurality of pages of data bits, via:
    programming, in a first pass, a threshold voltage of each respective memory cell in the page of the memory cells to a respective first level representative of a combination of bit values, each of the bit values being from one of the plurality of pages of data bits;
    computing a group identification for the respective memory cell; and
    increasing a voltage applied to the page of the memory cells to a sequence of read voltages in an increasing order to retrieve the plurality of pages of data bits from the page of the memory cells.

20. The memory sub-system of claim 19, wherein the threshold voltage is programmed in the first pass according to a first mapping between combinations of bit values and threshold levels, each of the threshold levels being in one of a plurality of groups, each of the plurality of groups containing a subset of the threshold levels and having a set of associated read voltages that separate threshold levels in the subset;
  wherein the group identification is configured to identify a first group, among the plurality of groups, containing the respective first level;
  wherein the group identification has at least two bits; and
  wherein read voltages of the plurality of groups are interleaved in the sequence.

* * * * *